(12) United States Patent
Yamazaki

(10) Patent No.: US 6,555,420 B1
(45) Date of Patent: Apr. 29, 2003

(54) SEMICONDUCTOR DEVICE AND PROCESS FOR PRODUCING SEMICONDUCTOR DEVICE

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/384,647

(22) Filed: Aug. 27, 1999

(30) Foreign Application Priority Data

Aug. 31, 1998 (JP) .......................................... 10-245433

(51) Int. Cl.⁷ .............................................. H01L 21/00
(52) U.S. Cl. ..................... 438/158; 438/149; 438/163; 438/164; 438/166
(58) Field of Search ............................... 438/149, 158, 438/163, 164, 166

(56) References Cited

U.S. PATENT DOCUMENTS 6,100,954 A * 8/2000 Kim et al. ................... 349/138
6,339,417 B1 * 1/2002 Quanrud ....................... 345/98

FOREIGN PATENT DOCUMENTS

| DE | 197 12 233 A1 | 10/1997 |
| GB | 2 311 653 A | 10/1997 |

OTHER PUBLICATIONS

European Search Report re application No. EP 99 11 6987, dated Mar. 27, 2000.
Patent Abstracts of Japan re JP 6–273799, to Sharp Corp., published Sep. 30, 1994.
Patent Abstracts of Japan re JP 7–302909, to Sony Corp., published Nov. 11, 1995.
Patent Abstracts of Japan re JP 9–026602, to Sony Corp., published Jan. 28, 1997.
Patent Abstracts of Japan re JP 9–116156, to Sony Corp., published May 2, 1997.
Patent Abstracts of Japan re JP 9–246554, to Matsushita Electric Ind Co. Ltd., published Sep. 19, 1997.
Enlgish abstract re JP 8–15686; Jan. 19, 1996.
English abstract re JP 8–279618; Oct. 22, 1996.
English abstract re JP 8–293612; Nov. 5, 1996.
English abstract re JP 9 45930; Feb. 14, 1997.
English abstract re JP 10–41519; Feb. 13, 1998.
English abstract re JP 10–135467; May 22, 1998.
English abstract re JP 10–161158; Jun. 19, 1998.
English abstract re JP 10–223903; Aug. 21, 1998.

(List continued on next page.)

*Primary Examiner*—Amir Zarabian
*Assistant Examiner*—Christy Novacek
(74) *Attorney, Agent, or Firm*—Cook, Alex, McFarron, Manzo, Cummings & Mehler, Ltd.

(57) ABSTRACT

In a TFT using a crystalline semiconductor film of a bottom gate type, a gate insulating film is flattened. On a substrate, an underlying film, a gate wiring and a gate insulating film are accumulated in this order. The gate insulating film includes a flattening film including an insulating organic resin film, such as BCB, polyimide and acrylic, and an insulating inorganic film. Because the surface of the gate insulating film is flattened by the flattening film, a flat amorphous semiconductor film can be formed on the surface thereof. Therefore, in the laser crystallization, since no difference in focal point of the laser light is formed among each position of the semiconductor film, crystallization can be uniformly conducted. Because the edge part of the gate wiring can be covered with the thick flattening film, implantation of an electron or a hole to the gate insulating film, and electrostatic breakage of the gate insulating film can be prevented.

41 Claims, 18 Drawing Sheets

OTHER PUBLICATIONS

Perettie, D.J. et al, "Benzocyclobutene as a Planarization Resin for Flat Panel Displays," Dow Chemical Company Central Research, *SPIE Liquid Crystal Materials, Devices, and Applications*, vol. 1665, pp. 331–337, 1992.

Perettie, D.J. et al, "Benzocyclobutene as a Planarization Overcoat for Flat Displays," Dow Chemical Company, *Asia Display '95, Proceedings of the 15th International Display Research Conference, Hamamatsu, Japan, Oct. 16–18, 1995*, pp. 721–724.

Lim, B.C. et al, "High Performance Amorphous Silicon Tin Film Transistor with a Planarized $SiN_x$/BCB Double–Layered Gate Insulator," *AM–LCD '98, Digest of Technical Papers, 1998 International Workshop on Active–Matrix Liquid–Crystal Displays, Tokyo, Japan, Jul. 9–10, 1998*, TFT 2-5, pp. 73–76.

Lan, J.H., et al, "Fully Planarized a–Si:H TFTs for AM–LCDs," *AM–LCD 98, Digest of Technical Papers, 1998 International Workkshop on Active–Matrix Liquid–Crystal Displays, Tokyo, Japan*, Jul. 9–10, 1998, TFT 2-6, pp. 77–80.

U.S. patent application No. 09/363,954 (pending) to Yamazaki et al filed Jul. 29, 1999, including specification, claims, abstract and drawings.

U.S. patent application No. 09/377,657 (pending) to Yamazaki et al filed Aug. 19, 1999, including specification, claims, abstract, drawings, preliminary amendment A and PTO filing receipt.

\* cited by examiner

FIG. IA
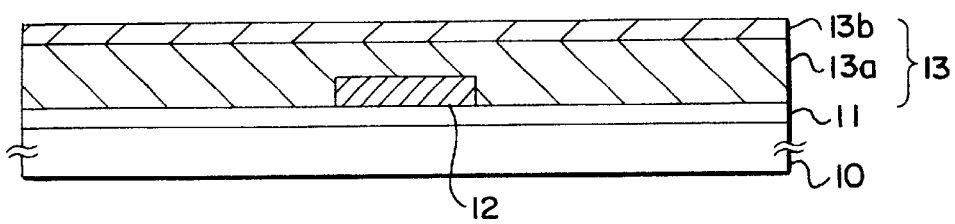
FIG. IB
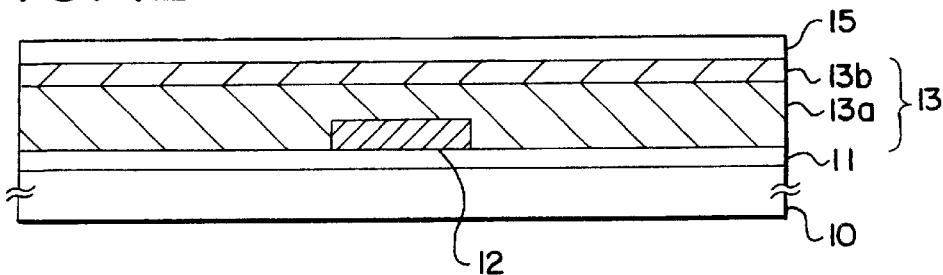
FIG. IC
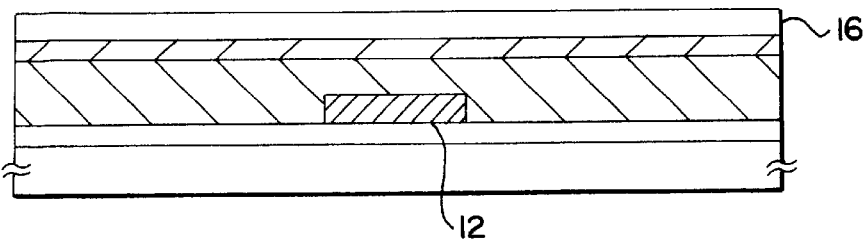
FIG. ID
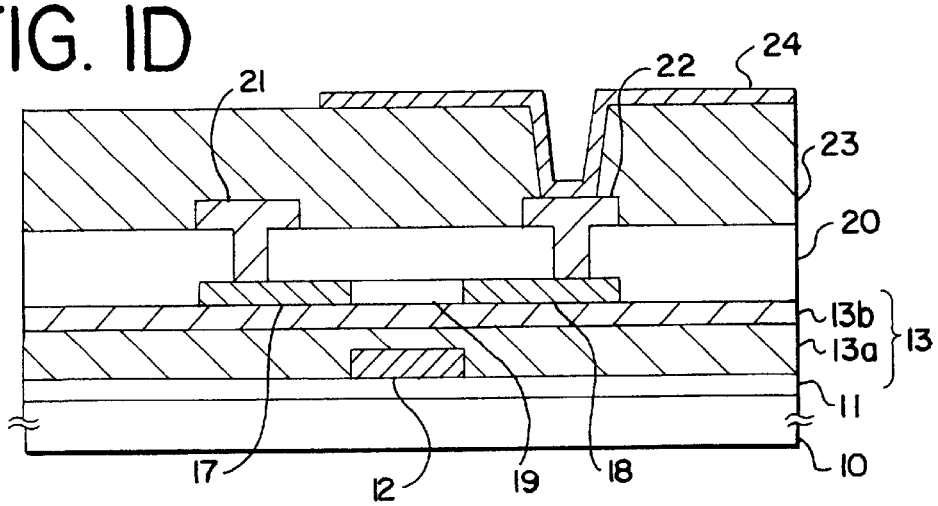

N CHANNEL TFT          P CHANNEL TFT

SEMICONDUCTOR DEVICE AND PROCESS FOR PRODUCING SEMICONDUCTOR DEVICE

BACKGROUND OF THE INVENTION

1. Field of the Invention

The present invention relates to a process for producing a semiconductor device by using a crystalline semiconductor thin film. The semiconductor device of the invention includes not only a single device, such as a thin film transistor, but also an electronic apparatus having a semiconductor circuit comprising a thin film transistor, a liquid crystal display device typically using an active matrix substrate, and another electronic device equipped with an image sensor, such as a personal computer and a digital camera.

2. Description of the Related Art

A thin film transistor (TFT) is used in various integrated circuits, and because a TFT can be produced on an insulating substrate, such as glass and quartz, it is suitable as a switching device of a matrix circuit of an active matrix type liquid crystal display device.

As a semiconductor layer of a TFT, an amorphous silicon film and a polycrystalline silicon film are generally employed. In order to constitute a driver circuit of a matrix circuit with a TFT, a polycrystalline silicon film having a high mobility must be used as the semiconductor layer. In general, in order to form a polycrystalline silicon film used as the semiconductor layer, an amorphous silicon film is firstly formed, and then the amorphous silicon film is subjected to heat crystallization, in which a heat treatment is conducted, or laser crystallization, in which excimer laser light is used for irradiation.

At the present time, the upper limit of the process temperature for the crystallization is demanded to be about 600° C. depending on the heat resistance of a glass substrate used in the active matrix substrate. Due to the use of a low crystallization temperature, a long period of time of 20 hours or more is required for the heat crystallization.

The laser crystallization technique using an excimer laser is a technique that realizes a process of a low temperature and a short processing time. Because the energy of excimer laser light is absorbed and converted into heat at a very surface of the amorphous silicon film of about 10 nm, an energy equivalent to heat annealing at about 1,000° C. can be applied to the amorphous silicon film in a short period of time without giving any heat influence to the substrate, and therefore a semiconductor film having a high crystallinity can be formed.

As a structure of a TFT, a bottom gate type (typically a reverse stagger type) and a top gate type (typically coplanar type) are typically known. In the bottom gate type one, a gate wiring (electrode), a gate insulating film and a semiconductor layer are accumulated in this order on a substrate, whereas in the top gate type one, which is the reverse of the bottom gate type, a semiconductor layer, a gate insulating film and a gate wiring (electrode) are accumulated in this order.

A process for producing a reverse stagger type TFT using polycrystalline silicon will be briefly described with reference to FIGS. 18A to 18D. FIGS. 18A to 18D are cross sectional views along the channel length (gate length).

A metallic film having a thickness of from 300 to 500 nm comprising, for example, Cr or Ta is formed by sputtering method on a glass substrate 1, and is patterned into a tapered shape to form a gate wiring 2. A gate insulating film 3 having a thickness of from 100 to 200 nm comprising, for example, $SiN_y$ (silicon nitride) or $SiO_2$ (silicon oxide) is then formed by a CVD method. An amorphous silicon film 4 having a thickness of from 50 to 100 nm is then formed by a CVD method. (FIG. 18A)

Crystallization is conducted by irradiation with excimer laser light to form a polycrystalline silicon film 5. (FIG. 18B)

The polycrystalline silicon film 5 is patterned to form a semiconductor layer 6. Impurities to be a donor or an acceptor are then selectively added to the semiconductor layer 6 to form a source region 6S, a drain electrode 6D and a channel-forming region 6C. (FIG. 18C)

An $SiO_2$ film is then formed as an interlayer insulating film 7 by a CVD method. A contact hole is formed in the interlayer insulating film 7, and a source electrode 8 and a drain electrode 9 are formed. (FIG. 18D)

In the production process of a reverse stagger type TFT using polycrystalline silicon as shown in FIGS. 18A to 18D, because the film thickness of the gate wiring is about from 300 to 500 nm, whereas the film thickness of the gate insulating film is from 100 to 200 nm, unevenness is formed on the surface of the amorphous silicon film 4 as reflecting the shape of the gate wiring 2.

In the laser crystallization, it is general that excimer laser light is shaped into a line-shaped beam or a rectangular beam, and the beam is used for irradiation by scanning. However, because of the unevenness on the surface of the amorphous silicon film 3, the focal point of the beam is different at each position on the surface, and thus energy to be applied to the amorphous silicon film 3 becomes different at each position. Because it is substantially difficult to change the focal point of the beam to comply with the unevenness, unevenness in crystallization occurs in the polycrystalline silicon film 5 due to the deviation of the focal point of the laser light. The unevenness in crystallization causes unevenness in threshold voltage of the TFT.

A TFT using polycrystalline silicon also has a problem that an off electric current is large. It is considered that the cause of the off electric current is that a voltage applied to the drain electrode 9 where the TFT is in an on state is concentrated at a coupling part of the channel forming region 6C and the drain region 6D, and an electric current leaks at the coupling part through a trap.

Furthermore, in a TFT using polycrystalline silicon, because the thickness of the gate insulating film 3 is from 100 to 200 nm, which is thinner than in the case of using amorphous silicon, there is a problem in coverage property of a step at an edge part of the gate wiring 2 (see FIG. 18D). Because $SiN_y$ and $SiO_2$ are difficult to grow by a CVD method at the edge part 2a, the thickness of the gate insulating film 2 becomes small. Accordingly, there tends to occur at the edge part 2a that the gate wiring 2 and the semiconductor layer 6 form a short circuit; the threshold voltage is shifted by implantation of an electron or a hole to the gate insulating film 3; and electrostatic breakage of the gate insulating film 3 occurs. These phenomena become factors deteriorating the reliability of the TFT.

SUMMARY OF THE INVENTION

An object of the invention is to solve the problems described above and to provide, in a semiconductor device of a bottom gate type comprising a gate wiring, a gate insulating film and a semiconductor layer accumulated in this order, a structure that provides uniformity in laser crystallization, and a process for producing such a structure. Another object of the invention is to provide a structure of a semiconductor device of a bottom gate type, in which an off electric current is suppressed to increase the reliability, and a process for producing such a semiconductor device.

In order to attain the objects, the invention provides a semiconductor device comprising by accumulating a gate electrode formed on an insulating surface; a gate insulating film comprising an accumulated film comprising a flattening film comprising an insulating organic resin and an insulating inorganic film, formed to cover the gate electrode; and a semiconductor layer covering the gate insulating film, wherein the semiconductor layer comprises a crystalline semiconductor film.

The invention also relates to a process for producing a semiconductor device having the accumulated structure described above, the process comprising a step of forming a gate wiring on an insulating surface;

a step of forming a flattening film comprising an insulating organic resin to cover the gate wiring;

a step of forming an insulating inorganic film in contact with the flattening film;

a step of forming a semiconductor film having an amorphous component to cover the insulating inorganic film; and a step of crystallizing the semiconductor film having an amorphous component to form a crystalline semiconductor film.

The term gate electrode used herein means a point of intersection of the gate wiring and the semiconductor layer. The source/drain wiring and the source/drain electrode are the same relationship as that between the gate wiring and the gate electrode.

In the constitution described above, the step between the gate electrode and the gate wiring is filled with the flattening film, and thus the surface of the gate insulating film becomes flat. Therefore, the semiconductor film having an amorphous component can be formed on a flat surface, and thus the semiconductor film itself can be made as a flat film. As a result, when laser light is applied thereto, there is no difference in focal point in each position, and the crystallization can be conducted uniformly in comparison to the conventional technique.

The insulating organic resin film can be generally formed by a coating method, and the coated film is further excellent in step coverage property in comparison to the insulating inorganic film formed by a gas phase method such as a CVD method. Therefore, in the insulating resin film, since the organic resin film does not become thin at the edge part of the gate wiring, the short circuit between the gate wiring and the semiconductor layer and the insulation breakage of the gate insulating film, which has been described above, can be prevented, so as to increase the reliability and the stability of the semiconductor device.

Furthermore, because the organic resin film has a smaller dielectric constant than that of the insulating inorganic film, a parasitic capacitance can be made small even when the gate insulating film is an accumulated film.

Since the insulating inorganic film is formed by a chemical vapor phase method such as a CVD method or a physical vapor phase method such as a sputtering method, an amount of impurities mixed therein is smaller and the size of the impurities is smaller than in the organic resin film. Therefore, by using an accumulated film of the insulating organic resin film and the insulating inorganic film, the amount of pinholes in the gate insulating film can be decreased, and the interface state between the semiconductor layer and the gate insulating film can be lowered in comparison to the case where the semiconductor layer is formed on the organic resin film.

In the constitution described above, the semiconductor film having an amorphous component is an amorphous semiconductor film having no crystallinity or a semiconductor layer having crystallinity but containing substantially no crystalline particle having a size of an order of 100 nm or more, and specifically includes an amorphous semiconductor film and a microcrystalline semiconductor film. The microcrystalline semiconductor film is a semiconductor film comprising a mixed state of microcrystals containing crystalline particles having a size of from several nm to several tens nm and an amorphous phase.

More specifically, examples of the semiconductor film having an amorphous component include an amorphous silicon film, a microcrystalline silicon film, an amorphous germanium film, a microcrystalline germanium film and an amorphous $Si_xGe_{1-x}$ (0<x<1) film, and these semiconductor films are formed by a chemical vapor phase method, such as a plasma CVD method and a reduced pressure CVD method, and a physical vapor phase method, such as a sputtering method.

The thickness of the semiconductor film is about from 10 to 150 nm.

BRIEF DESCRIPTION OF THE DRAWINGS

FIGS. 1A to 1D are cross sectional views showing a process for producing a pixel TFT in Embodiment 1.

PREFERRED EMBODIMENTS OF THE INVENTION

Figure 2A:
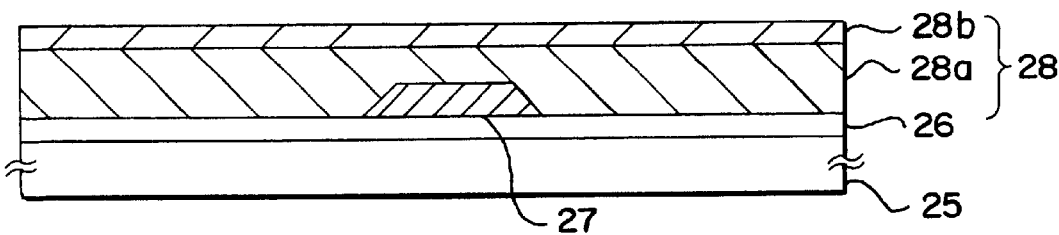
FIGS. 2A to 2D and 3A to 3C are cross sectional views showing a process for producing a pixel TFT in Embodiment 2.

Preferred embodiments of the invention will be described with reference to FIGS. 1A to 1D, 2A to 2D, and 3A to 3C. The embodiments are examples in which a reverse stagger type TFT is applied to a switching device of a matrix circuit of an active matrix substrate, i.e., a socalled pixel TFT.

Embodiment 1

This embodiment will be described with reference to FIGS. 1A to 1D.

As shown in FIG. 1A, a substrate 10 is prepared, and an underlying film 11 is formed on the surface of the substrate 10. As the substrate 10, an insulating substrate, such as a glass substrate, a quartz substrate, a ceramic substrate and a resin substrate, a single crystal silicon substrate, a stainless steel substrate, a Cu substrate, and a substrate comprising a high melting point metallic material, e.g., Ta, W, Mo, Ti and Cr, or an alloy thereof (for example, a nitrogen series alloy) can be used.

In the case where a back surface exposure process used in the production process of a bottom gate type TFT is employed, a material having transmissibility to light used for exposure is used as the substrate 10. Typically, a glass substrate, a quartz substrate, a ceramic substrate and a resin substrate may be used.

The underlying film 11 is a film for preventing diffusion of an impurity from the substrate to a semiconductor film. In the bottom gate type semiconductor device, since the semiconductor layer is isolated from the substrate by a gate insulating film, the underlying film may not be formed when an insulating substrate is used, but the adhesion property of an insulating film or a metallic film formed on the substrate 10 can be increased by forming the underlying film 11.

As the underlying film 11, an insulating inorganic film formed by a CVD method, such as a silicon oxide ($SiO_2$) film, a silicon nitride ($SiN_y$) film and a silicon oxynitride ($SiO_xN_y$) film. For example, in the case where a silicon substrate is used, the underlying film can be formed by oxidizing the surface thereof by heat oxidation. In the case where a heat resistant substrate, such as a quartz substrate or a stainless steel substrate, is used, it is possible that an amorphous silicon film is formed, and the silicon film is subjected to heat oxidation.

When the back surface exposure process is not employed, the underlying film 11 may comprise a film of a high melting point metal, such as tungsten, chromium and tantalum, or an accumulated film comprising a film having a high conductivity, such as an aluminum nitride film, as a lower layer, and the insulating inorganic film described above as an upper layer. In this case, heat generated in the semiconductor device is discharged from the film of the lower layer of the underlying film 11, and thus the operation of the semiconductor device can be stabilized.

A conductive film is formed on the underlying film 11, and is then patterned to form a gate wiring 12. As the conductive material for forming the gate wiring 12, a material mainly comprising Al or a material of a high melting point metal, e.g., Ta, W, Mo, Ti and Cr, and an alloy thereof (for example, an alloy of high melting point metals and an alloy of a high melting point metal and nitrogen) may be used. It may be formed by an accumulated film of the materials described above. For example, a two-layer film comprising an Al film containing several percent by weight of Sc and a Ta film, and a three-layer film comprising a Ta film sandwiched by tantalum nitride alloy films may be used.

In the case where the back surface exposure process used in the production process of a bottom gate type TFT is employed, a material having a light shielding property to light used for exposure is used as the material of the gate wiring.

A gate insulating film 13 is formed to cover the gate wiring 12. An insulating organic resin film as a flattening film 13a is formed by a spin coater. An insulating inorganic film 13b is then accumulated on the flattening film 13a by a sputtering method or a CVD method. (FIG. 1A) As the organic resin material used in the flattening film 13a, a film, on the surface of which the insulating inorganic film 13b can be directly accumulated by a sputtering method or a CVD method, is used, and a material that can endure a substrate temperature increased to about 300° C. in the later step is selected. For example, benzocyclobutene (BCB), polyimide and acrylic may be employed.

As the insulating inorganic film 13b, a single film of a silicon oxide ($SiO_2$) film, a silicon nitride ($SiN_y$) film or a silicon oxynitride ($SiO_xN_y$) film, or an accumulated film thereof may be used.

Since the insulating organic resin film can be formed by a coating method, the step formed by the gate wiring 12 can be embedded by the flattening film 13a to form the gate insulating film having a flat surface. By forming the flattening film 13a by a coating method, thinning of the flattening film 13a at the edge part of the gate wiring 12, which has occurred in the conventional technique, can be avoided. Therefore, the formation of a short circuit between the gate wiring 12 and the semiconductor layer, the shift of the threshold voltage caused by implantation of an electron or a hole to the gate insulating film 13, and the electrostatic breakage of the gate insulating film 13 can be prevented.

Conventionally, in order to increase the covering property of a gate insulating film, the gate wiring 12 is patterned into a tapered shape. However, the gate wiring 12 can be covered with the flattening film 13a having the sufficient thickness without patterning into a tapered shape. Therefore, the complicated taper etching step can be eliminated.

Because the insulating inorganic film 13b is formed as accumulated on the flattening film 13a, the pin hole density of the gate insulating film can be reduced to suppress the shift of the threshold voltage.

In the gate insulating film 13, the thickness of the flattening film 13a is from 10 nm to 0.1 $\mu$m at the part sandwiched by the highest part of the gate wiring 12 and the insulating inorganic film 13b, and the film thickness of the insulating inorganic film is from 50 nm to 0.1 $\mu$m.

A semiconductor film 15 having an amorphous component is formed by a gas phase method, such as a plasma CVD method, a reduced pressure CVD method and a thermal CVD method. Since the semiconductor film 15 is formed on the flat surface of the gate insulating film 13, it does not have unevenness reflecting the shape of the gate wiring 12, which has been the case in the conventional technique. (FIG. 1B)

The semiconductor film 15 is crystallized by irradiating with laser light having a wavelength of 400 nm or less or high intensity light having a wavelength of 400 nm or less, to form a crystalline semiconductor film 16. In the case, for example, where an amorphous silicon film is crystallized, a polycrystalline silicon film is formed. (FIG. 1C)

As a light source used in the crystallization, an excimer laser can be used. For example, a KrF excimer laser (wavelength: 248 nm), an XeCl excimer laser (wavelength: 308 nm), an XeF excimer laser (wavelength: 351 and 353 nm) and an ArF excimer laser (wavelength: 193 nm) can be used. As a light source emitting light having a wavelength of 400 nm or less, a mercury lamp can be used.

In the invention, the semiconductor film 15 is formed in a flat form in comparison to the conventional technique.

Therefore, the focus of the laser light irradiation or high intensity light does not become different among each position on the surface, and thus energy applied becomes uniform to reduce the unevenness in crystallization.

The resulting crystalline semiconductor film 16 is then patterned into an island form. An impurity endowing a conductive type to be a donor or an acceptor is selectively added to the semiconductor film of an island form, to form a source region 17 and a drain region 18. A substantially intrinsic part of the semiconductor layer is a channel forming region 19.

It is possible that, after the step of FIG. 1B, the step of FIG. 1C or the step of patterning the semiconductor film 16, an impurity for the control of the threshold value is added to a semiconductor film 26 or a semiconductor layer 28 to form the channel forming region 19 with an intrinsic semiconductor layer.

The term intrinsic used herein means a region containing no impurity that is capable of changing the Fermi level of silicon, and the term, and the term substantially intrinsic semiconductor used herein means a region, in which an electron and a hole are completely balanced to offset the conductive type, i.e., a region containing an impurity endowing a conductive type to be a donor or an acceptor in a concentration range (from $1 \times 10^{14}$ to $1 \times 10^{17}$ atoms/cm$^3$ by an SIMS analysis) where the threshold value can be controlled, or a region where the conductive type is offset by intentionally adding an impurity of the reverse conductive type.

The semiconductor layer is then covered with an interlayer insulating film 20, and contact holes reaching the source/drain regions 17 and 18 are opened to form a source wiring 21 and drain electrode 22 functioning as a signal line. An interlayer insulating film 23 is further formed to cover the source wiring 21 and the drain electrode 22. The interlayer insulating film 23 preferably comprises at least one flattening film comprising BCB, polyimide or acrylic to flat a cell gap. A contact hole reaching the drain electrode 22 is then formed, and a pixel electrode 24 comprising ITO or Al is formed.

While only one pixel TFT arranged at one pixel is described in FIGS. 1A to 1D, plural TFTs are arranged in a matrix on the substrate 10 on practical use.

Embodiment 2

This embodiment will be described with reference to FIGS. 2A to 2D and 3A to 3C. In this embodiment, as similar to Embodiment 1, an example where a bottom gate type TFT is applied to a pixel TFT of a matrix circuit is described.

While one million or more of pixel TFTs are generally formed in one matrix circuit, it is demanded that all the pixel TFTs have uniform characteristics, particularly a uniform threshold voltage. One of the large factors of shifting the threshold voltage is the condition of the interface between the channel and the gate insulating film.

Accordingly, this embodiment relates to a production process where the channel forming region of the semiconductor layer and an interface between the channel forming region and the insulating film are maintained to be clean.

As similar to Embodiment 1, a substrate 25 is prepared, and an underlying film 26 is formed on the surface of the substrate 25. A film comprising the conductive material described above is formed on the surface of the underlying film 26, and is patterned into a tapered shape to form a gate wiring 27. A gate insulating film 28 is then formed to cover the gate wiring 27. An insulating organic resin film comprising BCB, polyimide or acrylic is firstly formed as a flattening film 28a by a spin coater. An insulating inorganic film 28b, such as an SiO2 film, an SiN$_y$ film or an SiO$_x$N$_y$ film, is then formed on the flattening film 28a by a sputtering method or a CVD method. (FIG. 2A)

A semiconductor film 29 having an amorphous component and a protective film 30 comprising SiO2, SiN$_y$ or SiO$_x$N$_y$ are accumulated without exposing to the air. As means for forming these films, a CVD method and a sputtering method can be used. By forming the film without exposing to the air, no contamination substance is attached to an interface between the semiconductor film 29 and the protective film 30. The semiconductor film 29 and the protective film 30 may be continuously formed in one chamber, or may be formed in separate chambers by using a sputtering apparatus or a CVD apparatus of a multi-task type.

Alternatively, in order that interfaces among the gate insulating film 28, the semiconductor film 29 and the protective film 30 are maintained clean, the insulating inorganic film 28b, the semiconductor film 29 and the protective film 30 are preferably formed without exposing to the air. (FIG. 2B)

The thickness of the protective film 30 is from 5 to 50 nm, and typically from 10 to 20 nm. The protective film 30 protects the surface of the initial semiconductor film 29 from contamination by impurities in the air, and prevent the semiconductor film 29 from a photoresist directly formed thereon, so that the semiconductor film 29 is prevented from contamination. The protective film 30 also has a function of increasing the adhesive property to the photoresist.

Figure 2B:
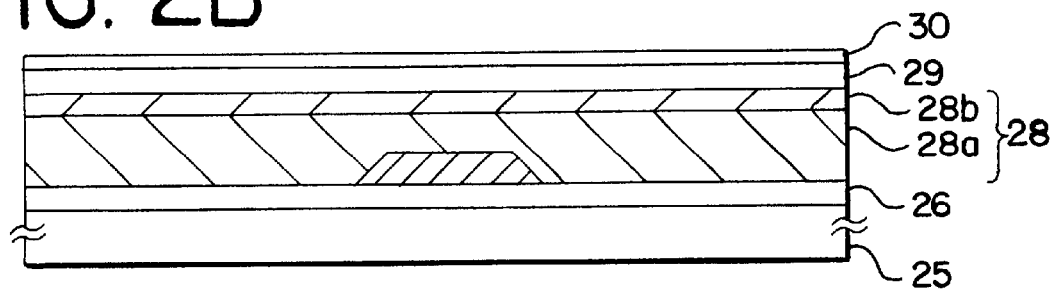

After obtaining the state shown in FIG. 2B, the semiconductor film 29 is irradiated with laser light having a wavelength of 400 nm or less or high intensity light equivalent thereto, as similar to Embodiment 1, to form a crystalline semiconductor film 31. In this step, the laser light or high intensity light equivalent thereto irradiates through the protective film 30, and thus the interface between the protective film 30 and the crystalline'semiconductor film 31 is maintained clean.

The protective film 30 and the crystalline semiconductor film 31 are patterned into an island form by using the same photoresist mask, to form a protective film 32 and a semiconductor layer 33. By maintaining the state where the upper surface of the semiconductor layer 33 is covered with the protective film 32, the semiconductor layer 33 can be protected from contamination by the air. (FIG. 2D)

Figure 2C:
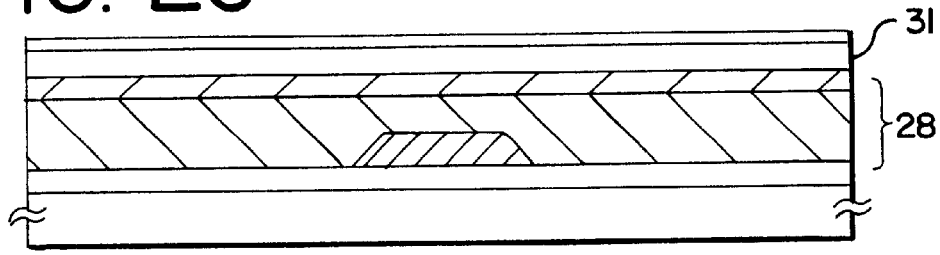
Figure 2D:
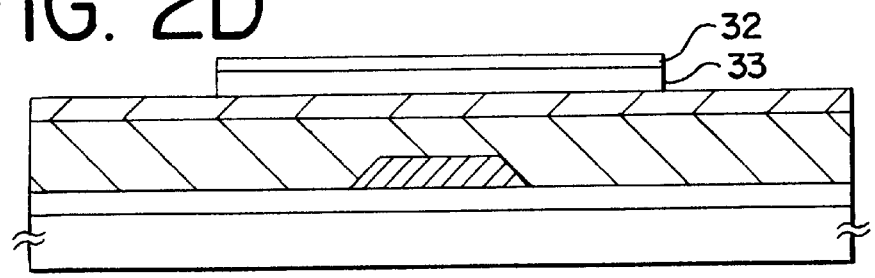

It is possible that, after the step of FIG. 2C or the step of FIG. 2D, an impurity for the control of the threshold value is added to a semiconductor film 31 or a semiconductor layer 33.

A photoresist is then coated, and the substrate is exposed to light from the back surface thereof, to form a resist mask 34 using the gate wiring 27 as a mask in a self alignment manner. In this embodiment, the amount of exposure is adjusted in such a manner that the width of the gate electrode in the channel length direction agrees to the width of the mask 34, i.e., the side surface of the gate electrode 27 meets the side surface of the mask 34.

Figure 3A:
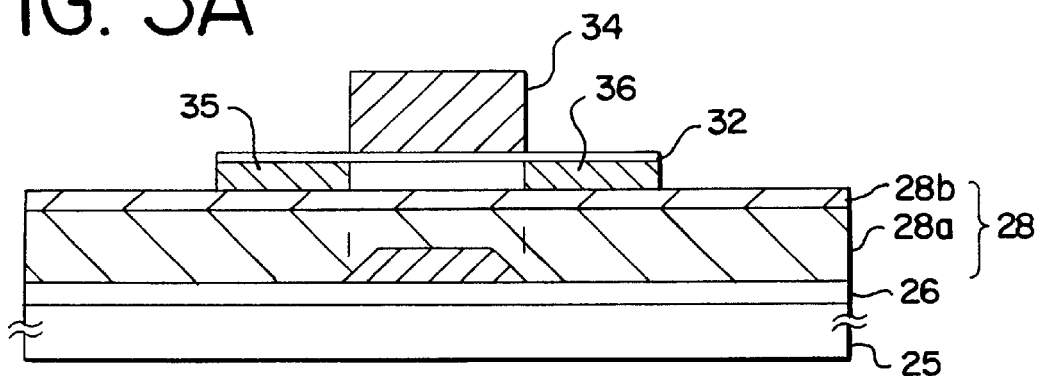
Figure 3B:
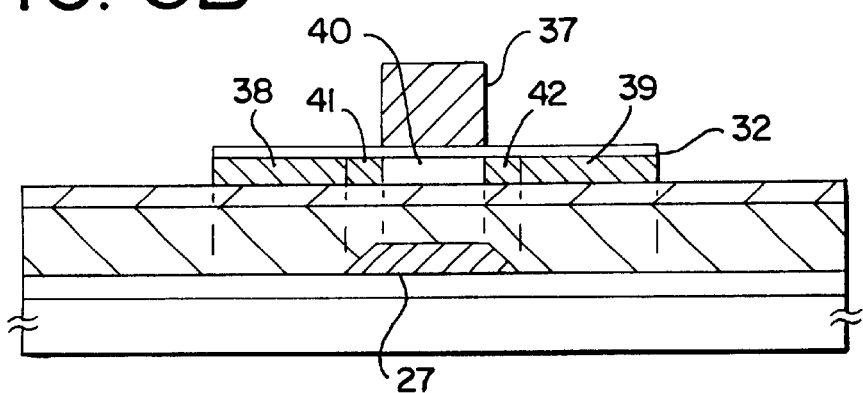
Figure 3C:
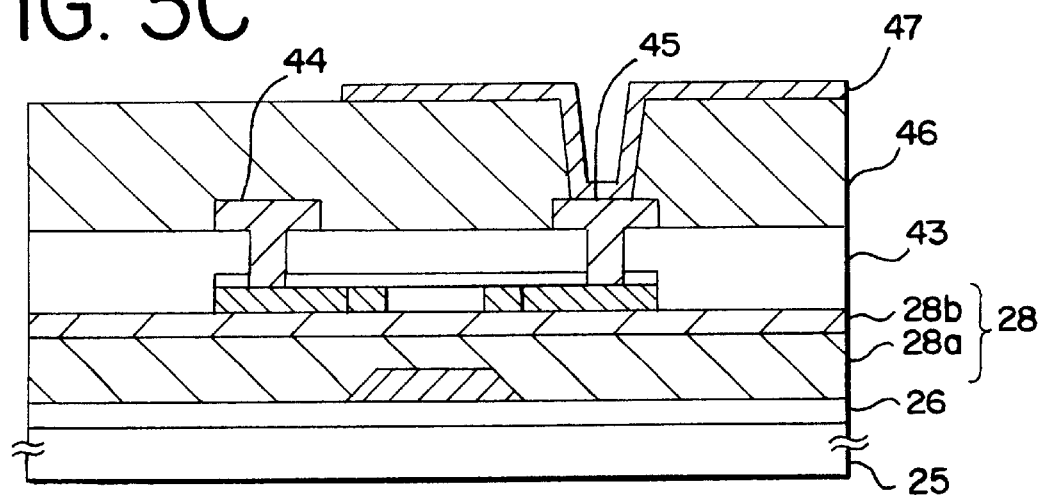

An impurity to be a donor or an acceptor is added to the semiconductor layer 33 through the protective film 32 by using the photoresist mask 34, to form an N type or P type impurity region 35 and 36. The regions 35 and 36 are parts to be a source/drain region. (FIG. 3A)

After removing the mask 34, a photoresist is again coated. The substrate is exposed to light from the back surface thereof to form a resist mask 37 using the gate wiring 27 as a mask in a self matching manner. In this case, the exposure is excessively conducted in comparison to the preceding exposure to make the width of the mask 37 thinner than the width of the gate electrode in the channel length direction, and thus the side surface of the mask 37 is inside the gate wiring 27. The length of the low concentration impurity region (LDD) and the channel length are determined by the mask 37.

An impurity to be a donor or an acceptor is added through the protective film 32 by using the photoresist mask 37 to form an N type or P type source region 38, an N type or P type drain region 39 and an N type or P type low concentration impurity region 41 and 42. An intrinsic region, to which no impurity is added in the two impurity addition steps, becomes a channel forming region 40. After the impurity addition step, annealing is conducted by irradiating with excimer laser light to activate the impurities added.

In this embodiment, the TFT has an LDD structure to increase the effect of lowering the off electric current. Furthermore, because the gate wiring 27 has a tapered shape, and the gate insulating film 28 comprises the flattening film 28a and the insulating inorganic film 28b, it has a structure that can further decrease the off electric current.

That is, since the flattening film 28a is formed to embed the step of the gate wiring 27, the gate wiring 27 has different film thickness in the slope part of the gate wiring 27 (which substantially corresponds to the part present under the low concentration impurity region 41 and 42) and in the flat part (which corresponds to the part present under the channel forming region 40), and the former thickness is larger than the later. Accordingly, the gate parasitic capacitance formed between the semiconductor layer 33 and the gate wiring 27 is different among each position, and the gate parasitic capacitance is high at the channel forming region 40, whereas the parasitic capacitance is low at the low concentration impurity region 44 and 42.

By using the structure described above, because a larger electric field is applied to a side where the gate parasitic capacitance is low in an off state, the electric field concentrated at the edge part of the channel forming region 40 can be diffused to the part of a low capacitance formed at the low concentration impurity region 41 and 42. As a result, the off electric current can be lowered, and the deterioration of the gate insulating film 28 can be prevented.

An interlayer insulating film 43 comprising SiO2, SiN$_y$ or SiO$_x$N$_y$ is then formed, and contact holes reaching the source/drain region 38 and 39, to form a source wiring 44 and a drain electrode 45 to be a signal line by patterning a metallic film.

Furthermore, an interlayer insulating film 46 is formed to cover the source wiring 44 and the drain electrode 45. The interlayer insulating film 46 preferably comprises at least one flattening film comprising BCB, polyimide or acrylic to flat a cell gap. Contact holes reaching the source wiring 44 and the drain electrode 45 are then formed in the interlayer insulating film 46, and a pixel electrode 47 comprising ITO or Al is formed.

Examples of the invention will be described with reference to FIGS. 4, 5A to 5E, 6A to 6D, 7A and 7B, 8A to 8D, 9A to 9C, 10A to 10D, 11A to 11D, 12, 13A, 13B, 14, 15A, 15B, 16A to 16F, and 17A to 17D.

EXAMPLE 1

In this example, a production process for producing a CMOS circuit with a reverse stagger type TFT will be described. While this example will be described with reference to only one CMOS circuit, plural circuits are formed on the same substrate on practical use.

Figure 4:
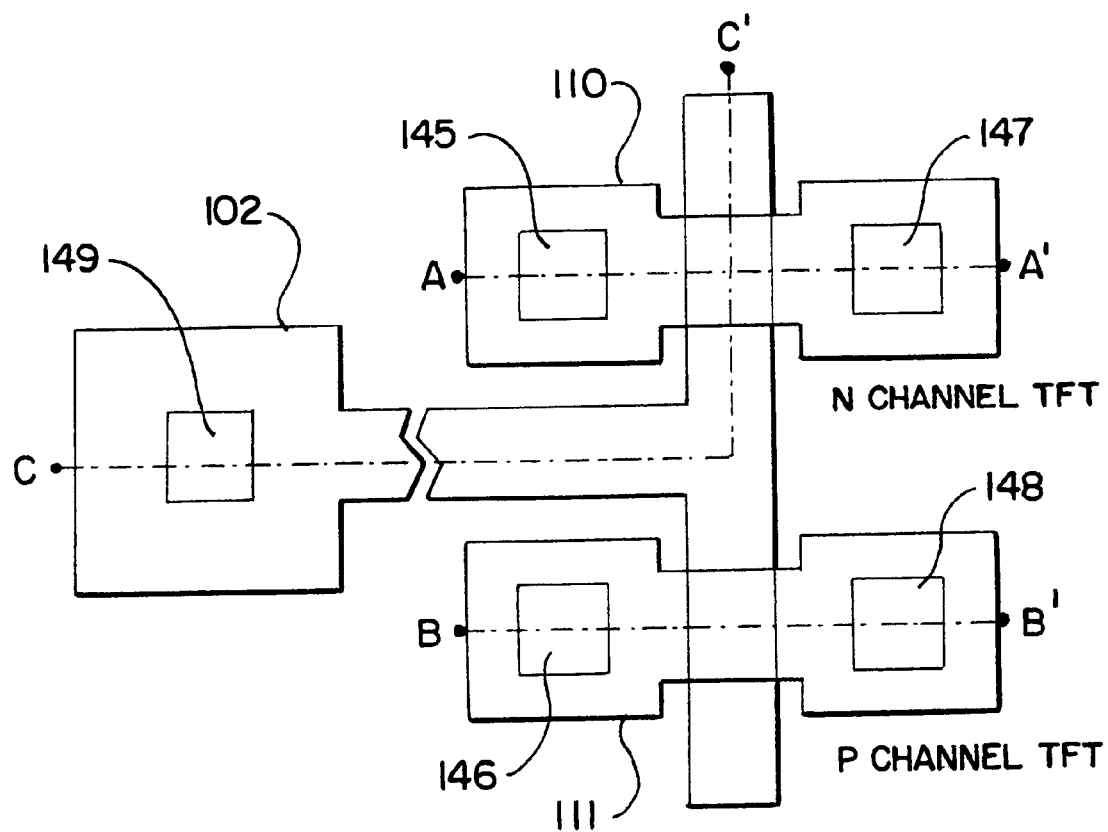
FIG. 4 is a plan view of a CMOS circuit of Example 1.

This example will be described with reference to FIGS. 4, 5A to 5E, and 6A to 6D. FIG. 4 shows a schematic plan view of the CMOS circuit. In FIG. 4, numeral 102 denotes a gate wiring, 110 denotes a semiconductor layer of an N channel TFT, 111 denotes a semiconductor layer of a P channel TFT, 145 and 146 denote contact parts of the semiconductor layers 110 and 111 with a source wiring, 147 and 148 denote contact parts of the semiconductor layers 110 and 111 with a drain wiring, and 149 denotes a contact part (gate contact part) of the gate wiring 102 with a lead wiring.

The production process of the TFT will be described with reference to FIGS. 5A to 5E, and 6A to 6D. In FIGS. 5A to 5E, and 6A to 6D, a cross sectional view of an N channel TFT is shown on the left side, and a cross sectional view of a P channel TFT is shown on the right side. The cross sectional view of the N channel TFT corresponds to a cross section along a chain line A–A', the cross sectional view of the P channel TFT corresponds to a cross sectional along a chain line B–B' in FIG. 4.

A 1737 glass substrate produced by Corning Inc. is used as a substrate 100. An SiN$_y$ film having a thickness of 200 nm is formed on the glass substrate 100 as an underlying film 101. An accumulated film comprising a tantalum nitride film (30 nm), a tantalum film (300 nm) and a tantalum nitride film (300 nm) is formed by a sputtering method, which is then subjected to dry etching using a mixed gas of CF$_4$ and O$_2$, to form a gate wiring 102 having a cross section of a tapered shape.

An accumulated film of a flattening film 103 and an insulating inorganic film 104 to be a gate insulating film is then formed on the gate wiring 102. The gate wiring 102 may be oxidized before forming the gate insulating film. The oxidation may be conducted by using one of a plasma oxidation method, an anodic oxidation method, and a thermal oxidation method. The plasma oxidation method is preferred in consideration of the throughput.

A BCB film is formed as the flattening film 103. A BCB solution is spin-coated by using a spin coater, and the coater is further rotated to evaporate a solvent. It is then baked in a heating furnace in an inert atmosphere such as nitrogen or a reduced pressure atmosphere at a temperature of from 200 to 250° C., to form a BCB film 103 on the whole surface of the substrate. A thickness of the BCB film 103 is 50 to 200 nm at a portion on the gate wiring 102. An SiO$_x$N$_y$ film having a thickness of 60 nm as the insulating inorganic film 104 is formed in contact with the BCB film 103, and an amorphous silicon film 105 having a thickness of 55 nm and an SiO$_x$N$_y$ film having a thickness of 100 nm as a protective film 106 are formed on and over the insulating inorganic film 104.

In this example, the process from the baking of the BCB film 103 to the formation of the protective film 106 comprising an SiO$_x$N$_y$ film are conducted in one CVD apparatus, and thus the substrate is not exposed to the air, to maintain the conditions of the interfaces among the film 103 to the film 106 good.

Figure 7A:
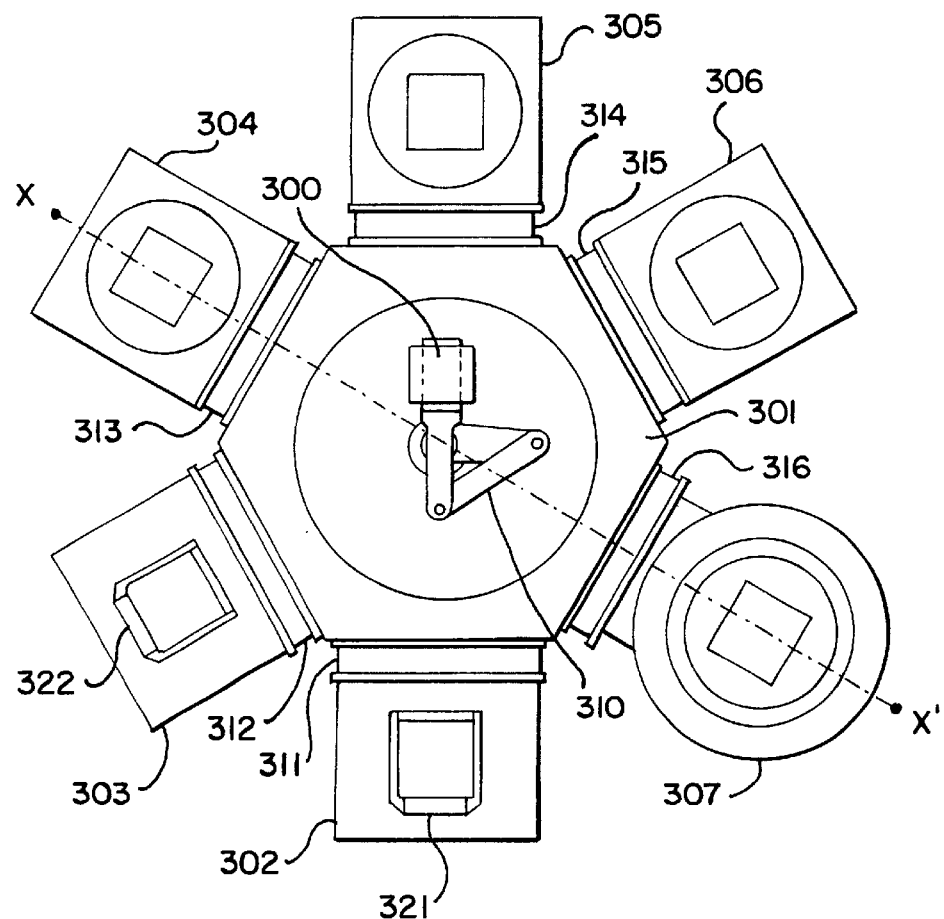
FIGS. 7A and 7B are schematic diagrams of a CVD apparatus used in Example 1.
Figure 7B:
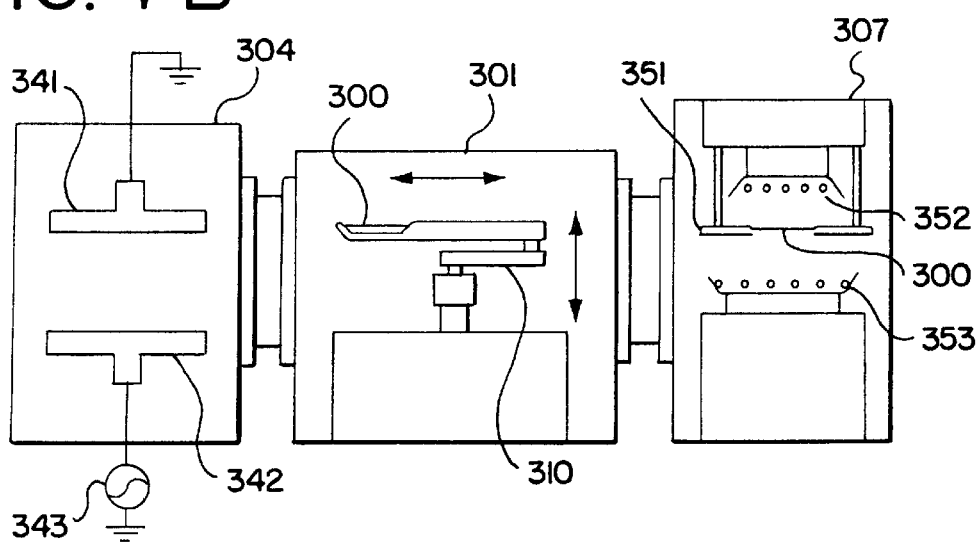

FIGS. 7A and 7B are schematic diagrams of the CVD apparatus used in this example. FIG. 7A is a plan view, and FIG. 7B is a cross sectional view along the chain line X–X'.

In FIGS. 7A and 7B, numeral 300 denotes a substrate to be processed, 301 denotes a common chamber, 302 and 303 denote load lock chambers, 304 to 306 denote CVD chambers, and 307 denotes a heating chamber. The chambers 302 to 307 are connected to the common chamber 301 with maintaining air tightness by gate valves 311 to 316. An exhaust system to make the chamber to have a reduced pressure and a gas supplying system to supply a control gas and a reaction gas to the atmosphere are connected to each of the chambers.

The common chamber 301 is equipped with a robot arm 310 to transfer the substrate 300 to be processed. The robot arm 310 freely moves three-dimensionally as shown by the arrow in the figure. The load lock chambers 302 and 303 are equipped with cartridges to load or unload the substrate 300 to be processed.

The CVD chambers 304 to 306 each has substantially the same constitution, and in this example, a plasma CVD apparatus of a parallel plate type comprising an upper electrode 341 connected to the ground and a lower electrode 342 connected to an RF power source 343 is employed. Other constitutions may be employed.

The heating chamber 307 is equipped with a substrate holder 351 to hold the substrate 300 to be processed, and heating lamps 352 and 353.

A process for forming the accumulated films 103 to 106 by using the apparatus shown in FIGS. 7A and 7B will be described below. A substrate coated with a BCB solution and dried is transferred to the heating chamber 307. The heating chamber 307 is made to have a nitrogen atmosphere, and the substrate is baked at 250° C. to form the BCB film 103. The substrate is then transferred to the CVD chamber 304 by the robot arm 310, and the $SiO_xN_y$ film (insulating inorganic film) 104 is formed at a substrate temperature of 300° C. by using $SiH_4$ and $N_2O$ as reaction gases. An amorphous silicon film 105 is then formed at a substrate temperature of 300° C. by supplying only $SiH_4$. By again supplying both $SiH_4$ and $N_2O$, the $SiO_xN_y$ film (protective film) 106 is formed at a substrate temperature of 300° C. The substrate having the films formed is transferred to the load lock chamber 302 or 303 to unload from the apparatus.

In this example, the films 104 to 106 are continuously formed in the one chamber, the chamber 304, to eliminate the change in temperature and contamination associated with transfer of the substrate. However, in view of the throughput of the process and the design of the gas supplying system of the apparatus, the insulating inorganic film 104, the semiconductor film 105 and the protective film 106 may be formed in separate CVD chambers. The formation of the semiconductor film, i.e., the amorphous silicon film 105, and the formation of the insulating films, i.e., the inorganic film 104 and the protective film 106, may be separated and conducted in different CVD chambers.

Figure 5A:
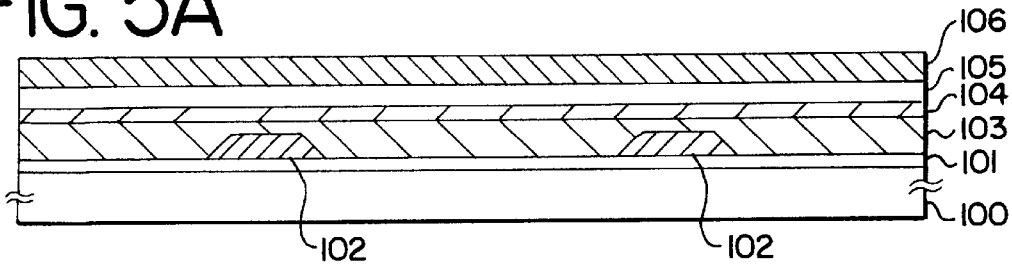
FIGS. 5A to 5E and 6A to 6D are cross sectional views showing a process for producing a CMOS circuit in Example 1.
Figure 5B:
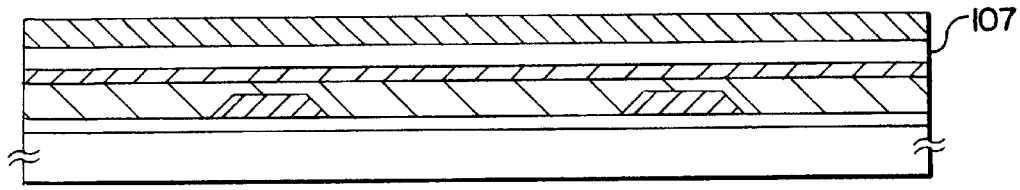

After obtaining the constitution comprising the underlying film 101 having the gate wiring 102, the BCB film 103, the $SiO_xN_y$ film 104, the amorphous silicon film 105 and the $SiO_xN_y$ film 106 accumulated thereon as shown in FIG. 5A, the amorphous silicon film 105 is crystallized by irradiating with KrF excimer laser light, to form a polycrystalline silicon film 107. The irradiation conditions include a pulse frequency of 30 Hz, and a laser energy density of from 100 to 500 mJ/cm², which is 350 mJ/cm² in this example. In this example, the laser light is shaped into a line form of 5 mm×12 cm by an optical system, and irradiates with scanning. (FIG. 5B)

While the term crystallization is used in this example since the semiconductor film 105 having an amorphous component is an amorphous silicon film before the irradiation with laser light (after formation of the film), it is not suitable in the case where the film after formation is a polycrystalline silicon film or a microcrystalline silicon film. In such a case, it is considered that the term improvement in crystallinity is more suitable. That is, it is appropriate to understand that the film is changed to a semiconductor film having a higher crystallinity by the irradiation with laser light.

Figure 5C:
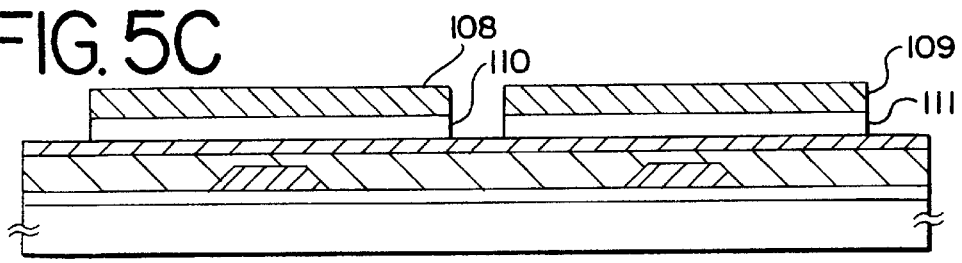

The protective film 106 comprising $SiO_xN_y$ and the polycrystalline silicon film 107 are patterned into an island form by using the same photoresist mask, to form protective films 108 and 109, and semiconductor layers 110 and 111. (FIG. 5C)

Figure 5D:
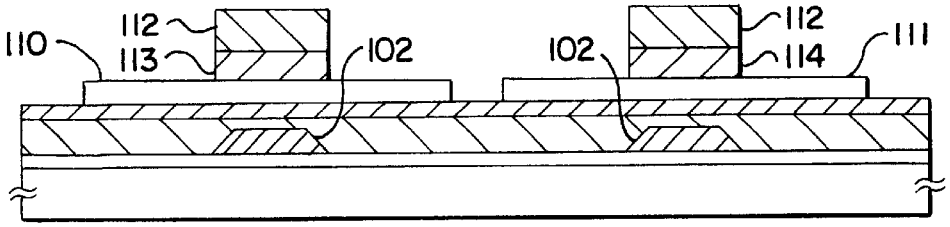

After removing the photoresist mask, another photoresist is applied, and the substrate 100 is exposed to light from the back surface thereof, to form a photoresist mask 112 by using the gate wiring 102 as a mask in a self alignment manner. The amount of exposure is adjusted in such a manner that the photoresist mask 112 has the same pattern as the gate wiring 102. The protective films 108 and 109 are patterned by using the photoresist mask 112 to form protective films 113 and 114. (FIG. 5D)

Figure 5E:
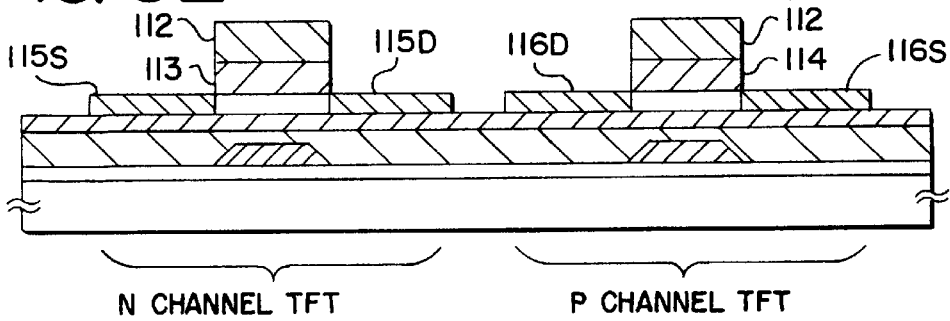

In the state where the photoresist mask 112 is present, a phosphorus ion as an impurity ion endowing an N type conductivity is added to the semiconductor layers 110 and 111 by a plasma doping method. In the semiconductor layers 110 and 111, N type impurity regions 115S, 115D, 116S, and 116D are formed. (FIG. 5E)

After removing the photoresist mask 112, another photoresist is applied, and exposure is conducted from the back surface, to form a photoresist mask 117 by using the gate wiring 102 as a mask. In this case, the amount of exposure is increased from the preceding exposure from the back surface, i.e., over-exposure, to make the mask 112 thinner than the width of the gate wiring 102, and thus the side surface of the mask 117 is made inside the side surface of the gate wiring 102. The width of the mask 117 in the channel length direction determines the channel amount of the TFT, and the distance from the side surface of the gate wiring 102 to the side surface of the mask 117 shifted inside therefrom determines the length of the low concentration impurity region. In this example, the side surface of the mask 117 is shifted inside from the side surface of the gate wiring 102 by about 1 μm.

Figure 6A:
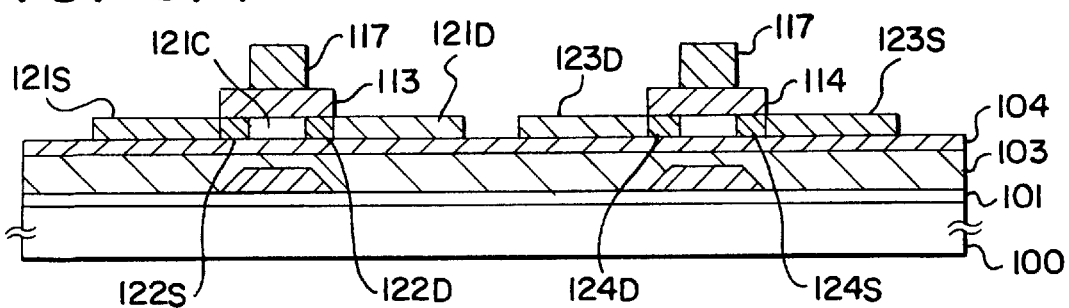
Figure 6B:
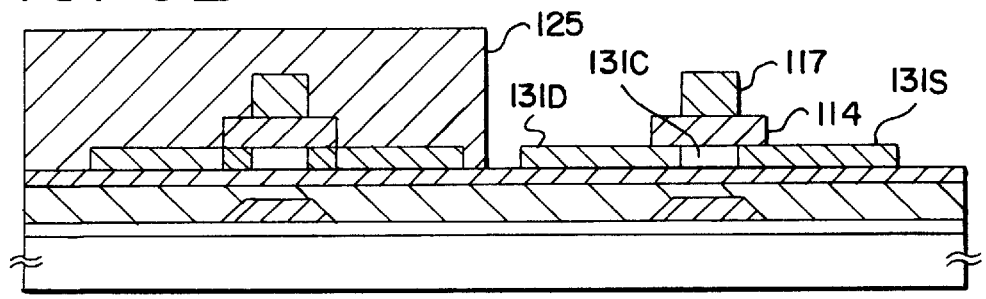

A phosphorous ion is again added to the semiconductor layers 110 and 111 by using the photoresist mask 117 and the protective films 113 and 114 as a mask. In this addition step, the ion is added to a lower concentration than the preceding addition step, and the acceleration voltage is increased, so that the phosphorous ion passes through the protective films 113 and 114. In the semiconductor layers 110 and 111, N⁺type regions 121S, 121D, 123S, and 123D, and N⁻type regions 122S, 122D, 124S, and 124D are formed. (FIG. 6A)

In the semiconductor layer 110, the N⁺type regions 121S and 121D become a source/drain region, and the N⁻type regions 122S and 122D become a low concentration impurity region. A region, to which no phosphorous ion is added in the two addition steps of a phosphorous ion, i.e., a region 121C covered with the mask 117, becomes a channel forming region.

In this example, because the low concentration impurity regions 122S and 122D are formed by adding the impurity in the state where the protective film 113 is present, the phosphorous concentration added to the low concentration impurity regions 122S and 122D can be easily controlled. Because the impurity is added to the source/drain regions 121S and 121D in the state where the protective film 113 is not present, a phosphorus ion can be added to a high concentration.

With the photoresist mask 117 remaining, a photoresist mask 125 covering the N channel TFT is formed. A boron ion is added to the semiconductor layer 111 by using the photoresist mask 117 and the protective film 114 as the masks. The conductive type of the N type region formed in the semiconductor layer 111 is reversed by this addition step, to form P⁺type regions 131S and 131D to be a source/drain region. A region 131C covered with the mask 117 becomes a channel forming region. (FIG. 6B) p By appropriately setting the conditions in the addition step of boron, such as the accelerated voltage, the dose amount and the number of the doping steps, the boron concentration of the region in that region of the P⁺type regions 131S and 131D which is covered with the protective film 114 can be reduced to make a P⁻type region.

After forming the source/drain region, phosphorus and the boron added are activated by irradiating with excimer laser light. An interlayer insulating film 140 covering the semiconductor layers is then formed. In this example, an accumulated film comprising an $SiN_y$ film having a thickness of 50 nm and an $SiO_2$ film having a thickness of 900 nm is formed. The $SiN_y$ film functions as a passivation film of the semiconductor layers. The $SiO_2$ film is preferably formed with a TEOS gas, which has a good step covering property. An organic resin film of BCB, polyimide or acrylic, or a coated film of silicon oxide series, such as SOG, PSG and BPSG, which have a good flatness, may be used instead of the $SiO_2$ film.

Figure 6C:
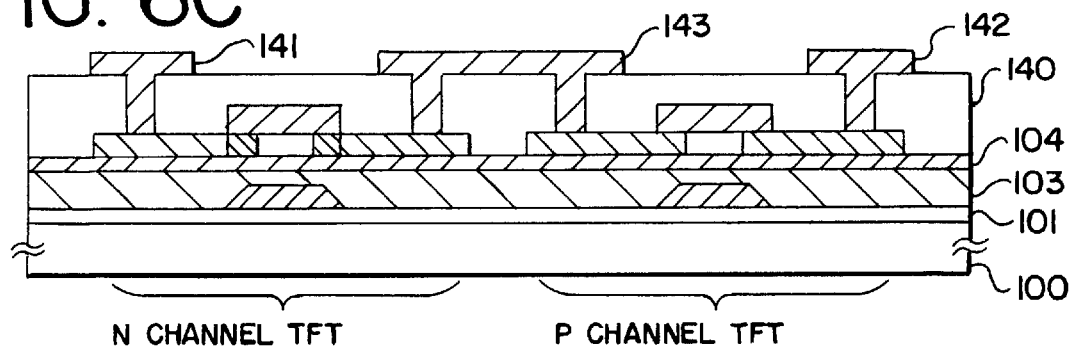

Contact holes are formed in the interlayer insulating film 140 at the contact parts 145 to 149 (see FIG. 4), and further a contact hole is formed in the BCB film 103 and the $SiO_xN_y$ film 104 at the gate contact part 149. An accumulated film comprising a Ti film having a thickness of 150 nm, an Al film having a thickness of 300 nm, and a Ti film having a thickness of 100 nm is formed and patterned to form wirings 141 to 143 and a lead wiring 144. (FIG. 6C)

Figure 6D:
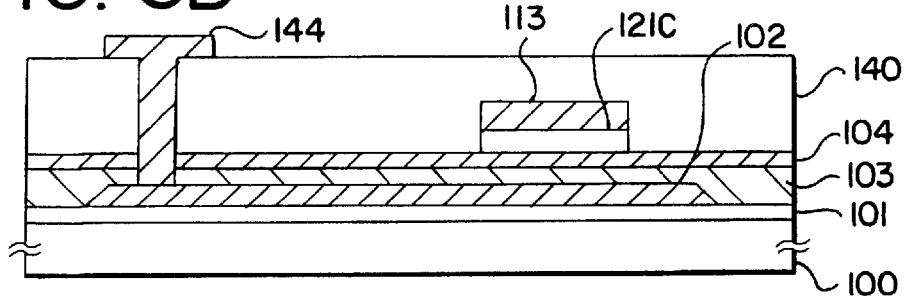

A cross sectional view of the CMOS circuit along the chain line C–C' in FIG. 4 is shown in FIG. 6D. In this example, the TFTs are separated (FIG. 5C), and patterning is conducted by using the gate wiring as a mask in a self alignment manner (FIG. 5D), to form the protective films 113 and 114, and therefore, even in the TFT having the gate wiring 102 in common, the protective films 113 and 114 are independent for the respective TFTs. Furthermore, the length of the protective films 113 and 114 in the channel width direction is the same as the semiconductor layers 110 and 111, i.e., the channel width. The length thereof in the channel length direction is the same as the width of the gate wiring 102.

In this example, because the gate wiring 102 has a tapered shape, the film thickness of the BCB film 103 is different between the slope part and the flat part of the gate wiring 102, as described in Embodiment 2, and thus the gate parasitic capacitance is decreased from the channel forming region toward the outside. In the off state, therefore, the voltage applied to the channel forming regions 121C and 131C can be diffused to the part having a small parasitic capacitance. In particular, because the overlapping part, where the drain region 131D overlaps the gate wiring 102 in the P channel TFT, has a smaller parasitic capacitance than that of the channel forming region 131C, the voltage concentrated at the coupling part between the channel forming region 131C and the source/drain region 131S and 131D can be relaxed, and the off electric current can be reduced.

EXAMPLE 2

This example is a modification of Example 1. In Example 1, the crystalline semiconductor film is patterned into an island form, and then the source/drain region is formed. In the production process in this example, on the other hand, a source/drain region is formed, and then a crystalline semiconductor film is patterned.

This example will be described with reference to FIGS. 8A to 8D and 9A to 9C. In FIGS. 8A to 8D and 9A to 9C, the same symbols in FIGS. 5A to 5E and 6A to 6D represent the same constitutional components. A plan view of a CMOS circuit corresponds to FIG. 4, and the cross sectional views in FIGS. 8A to 8D and 9A to 9C are cross sections of the TFT along the direction of the channel length (the chain lines A–A' and B–B' in FIG. 4).

Figure 8A:
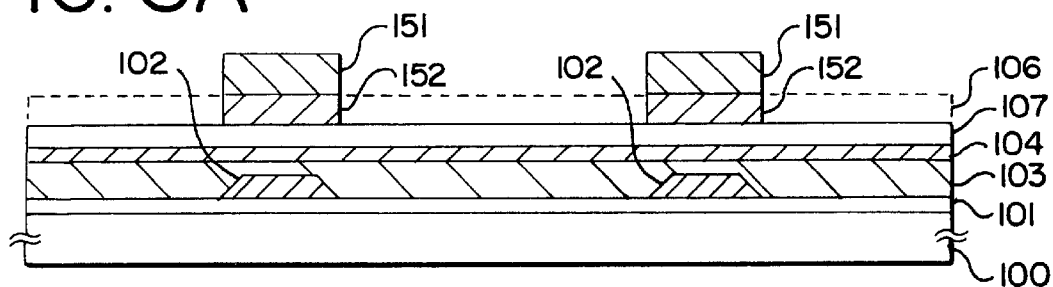
FIGS. 8A to 8D and 9A to 9C are cross sectional views showing a process for producing a CMOS circuit in Example 2.

The steps comprising up to the state shown in FIG. 5B are conducted according to the process of Example 1. A photoresist is coated, and the substrate 100 is exposed to light from the back surface thereof, to form a photoresist mask 151 by using the gate wiring 102 as a mask in a self alignment manner. The amount of exposure is adjusted in such a manner that the photoresist mask 151 has the same pattern as the gate wiring 102. The protective film 106 comprising $SiO_xN_y$ is patterned by using the photoresist mask 151 to form a protective film 152. (FIG. 8A)

While in FIGS. 8A to 8D, the protective film 152 is shown as separated, the protective film 152 has the same pattern as that of the gate wiring 102, and is common to the two TFTs.

Figure 8B:
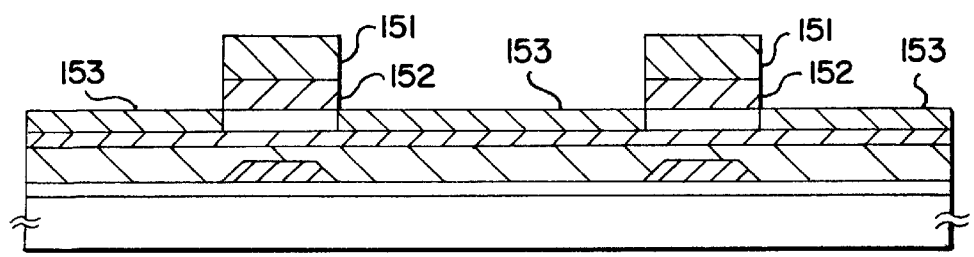

A phosphorus ion is added by using the photoresist mask 151 and the protective film 152 as a mask by a plasma doping method, to selectively form an N type impurity region 153 in the polycrystalline silicon film. (FIG. 8B)

After removing the photoresist mask 151, another photoresist is applied, and exposure is conducted from the back surface, to form a photoresist mask 155 by using the gate wiring 102 as a mask in a self alignment manner. In this case, the amount of exposure is increased in comparison to the preceding exposure from the back surface, i.e., overexposure is conducted. That is, the photoresist mask 155 is made thinner than the width of the gate wiring 102, and thus the side surface of the mask 155 is made inside the side surface of the gate wiring 102. The width of the mask 155 in the direction of the channel length determines the channel length of the TFT, and the distance from the side surface of the gate wiring 102 to the side surface of the mask 155 shifted inside therefrom determines the length of the low concentration impurity region. In this example, the side surface of the mask 155 is shifted inside from the side surface of the gate wiring 102 by about 1 μm.

Figure 8C:
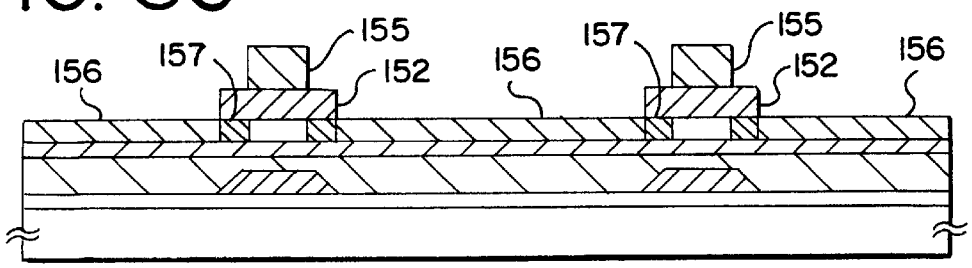

A phosphorus ion is again added by using the photoresist mask 155 and the protective film 152 as a mask. In this addition step, the ion is added to a lower concentration than the preceding addition step, and the acceleration voltage is increased, so that the phosphorous ion passes through the protective film 152, to form an N⁺type region 156 and an N⁻type region 157 in the polycrystalline silicon film 107. (FIG. 8C)

Figure 8D:
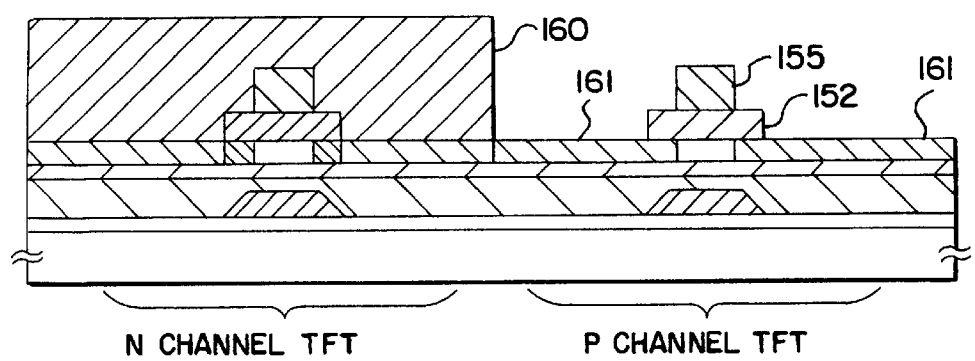

With the photoresist mask 155 remaining, a photoresist mask 160 covering the N channel TFT is formed. A boron ion is added to the polycrystalline silicon film 107 by using the photoresist mask 155 and the protective film 152 as a mask. In this addition step, the conductive type of the N type regions 156 and 157 in the P channel TFT is reversed to form a P⁺type region 161 to be a source/drain region. (FIG. 8D)

By appropriately setting the conditions in the addition step of boron, such as the accelerated voltage, the dose amount and the number of the doping steps, the boron concentration of the region in that region of the P⁺type region 161 which is covered with the protective film 152 can be reduced to make a P⁻type region.

After removing the photoresist masks 155 and 160, phosphorus and the boron added is activated by irradiating with excimer laser light.

The polycrystalline silicon film 107 is then patterned into an island form for the respective TFTs, to separate an N type region and a P type region. The protective film 152 is also separated for the respective TFTs, to form protective films 165 and 166.

Figure 9A:
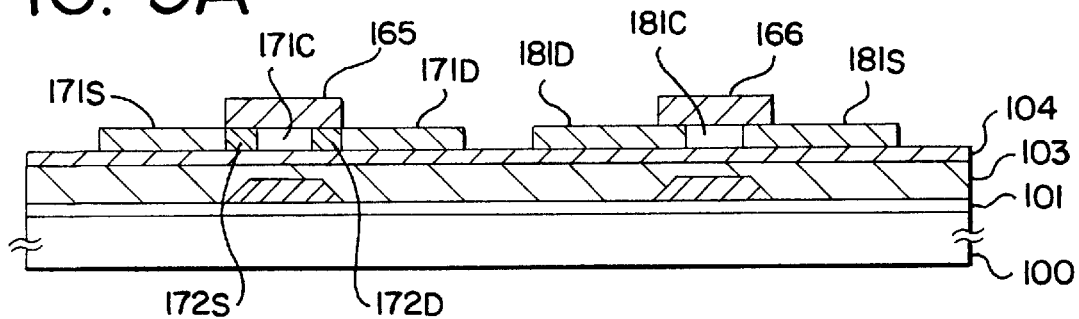

In the semiconductor layer of the N channel TFT, source/drain regions 171S and 171D comprising the N$^+$type region 156, low concentration impurity regions 172S and 172D comprising the N$^-$type region 157, and a channel forming region 171C comprising a region covered with the mask 155 are formed. In the semiconductor layer of the P channel TFT, on the other hand, source/drain regions 181S and 181D comprising the P$^+$type region 161 and a channel forming region 181C comprising a region covered with the mask 155 are formed. (FIG. 9A)

An interlayer insulating film 190 is formed to cover the semiconductor layers. In this example, an accumulated film comprising an SiN$_y$ film having a thickness of 50 nm and an SiO$_2$ film having a thickness of 900 nm is formed. Contact holes for the source/drain regions and a contact hole for the gate contact part are formed in the interlayer insulating film 190. Furthermore, in the gate contact part, the insulating inorganic film 104 comprising SiO$_x$N$_y$ and the flattening film 103 comprising BCB are etched to form a contact hole reaching the gate wiring 102. An accumulated film comprising a Ti film having a thickness of 150 nm, an Al film having a thickness of 300 nm and a Ti film having a thickness of 100 nm is formed and patterned to form wirings 191 to 193 and a lead electrode 194, so that the CMOS circuit is completed. (FIG. 9B)

Figure 9B:
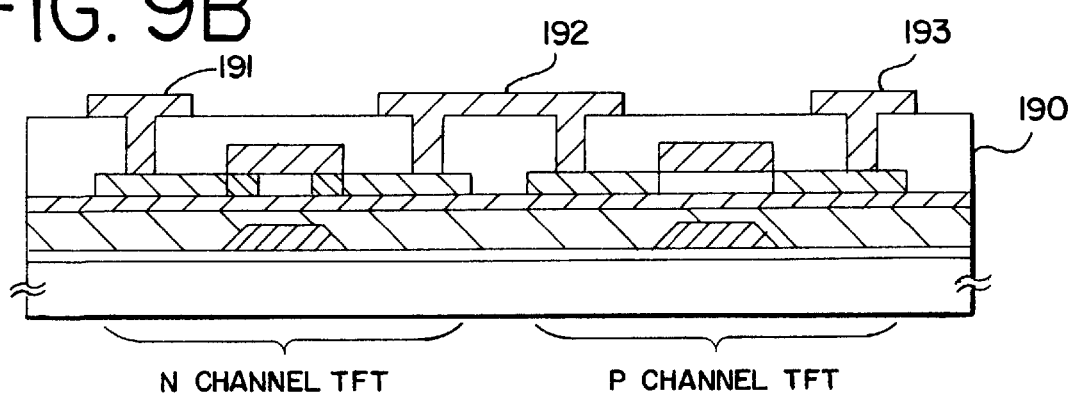
Figure 9C:
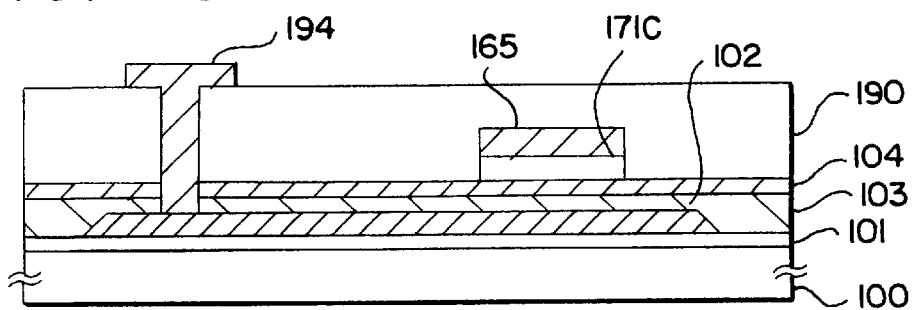

A cross sectional view of the N channel TFT along the direction of the channel width in FIG. 9B is shown in FIG. 9C. The protective films 165 and 166 in this example have the same length in the direction of the channel width as the channel width, and the same length in the direction of the channel length as the width of the gate wiring 102, as similar to the protective films 113 and 114 in Example 1.

EXAMPLE 3

This example is a modification of Example 2. In Example 2, the protective film 152 is not present on the source/drain region, and the surface thereof is exposed. In this example, the surface of the semiconductor layer is not exposed. This example shows a process in that the source/drain region of the N channel TFT does not overlap the gate wiring. By eliminating the overlap, deterioration of the TFT can be prevented.

This example will be described with reference to FIGS. 10A to 10D and 11A to 11D. According to the process of Example 1, an underlying film 201 comprising an SiO$_2$ film having a thickness of 200 nm is formed on a glass substrate 200. A Cr film having a thickness of 500 nm is formed on the underlying film 201 and etched into a tapered shape to form a gate wiring 202. The CMOS circuit of this example also corresponds to the plan view in FIG. 4, and the gate wiring 202 is common to the two TFTs.

A BCB solution is then applied by a spin coater, and a solvent is dried. The coated film is baked at 250° C. in a nitrogen atmosphere to form a BCB film 203. A thickness of the BCB film 203 is 50 to 200 nm at a portion on the gate wiring 202. An accumulated film comprising an SiN$_y$ film 204 having a thickness of 50 nm, an amorphous silicon film 205 having a thickness of 50 nm, and an SiN$_y$ film having a thickness of 50 nm as a protective film 206 is formed on the surface of the BCB film 203.

Figure 10A:
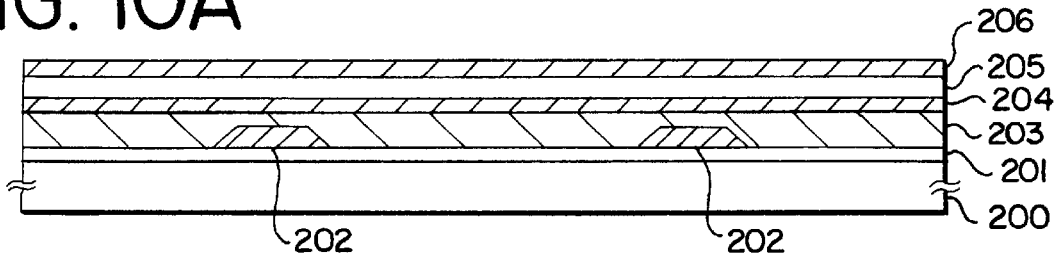
FIGS. 10A to 10D and 11A to 11D are cross sectional views showing a process for producing a CMOS circuit in Example 3.

In this example, as similar to Example 1, the steps of from the baking of the BCB film 203 to the formation of the protective film 206 are conducted by using the apparatus shown in FIGS. 7A and 7B without opening to the air, and the surface of the substrate is not exposed to the air. In this example, because an impurity is added to the source/drain region through the protective film 206, the thickness thereof is thinner than in Examples 1 and 2, and is preferably from 10 to 60 nm. (FIG. 10A)

Figure 10B:
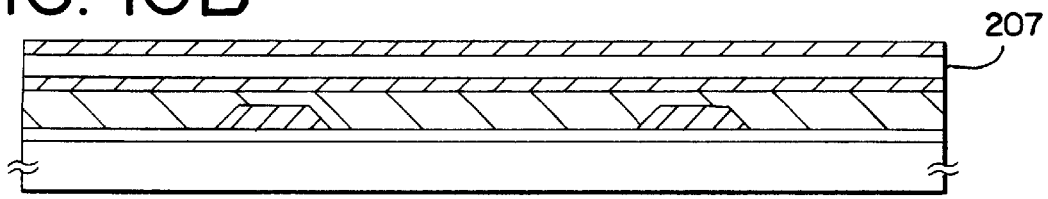

The amorphous silicon film 205 is crystallized by irradiating with KrF excimer laser light to form a polycrystalline silicon film 207. The irradiation conditions include a pulse frequency of 30 Hz, and a laser energy density of 300 mJ/cm$^2$, and the laser light is shaped into a line form of 5 mm×12 cm by an optical system, and irradiates. (FIG. 10B)

A photoresist is applied, and exposure is conducted from the back surface by using the gate wiring 202 as a mask, to form a photoresist mask 208 in a self alignment manner. In this case, over-exposure is conducted to make the mask 208 thinner than the width of the gate wiring 202, and the side surface of the mask 208 is inside the side surface of the gate wiring 202. The width of the mask 208 in the channel length direction determines the channel length of the TFT, and the distance from the side surface of the gate wiring 202 to the side surface of the mask 208 shifted inside therefrom determines the length of the low concentration impurity region. In this example, the side surface of the mask 208 is shifted inside from the side surface of the gate wiring 202 by about 1 µm.

Figure 10C:
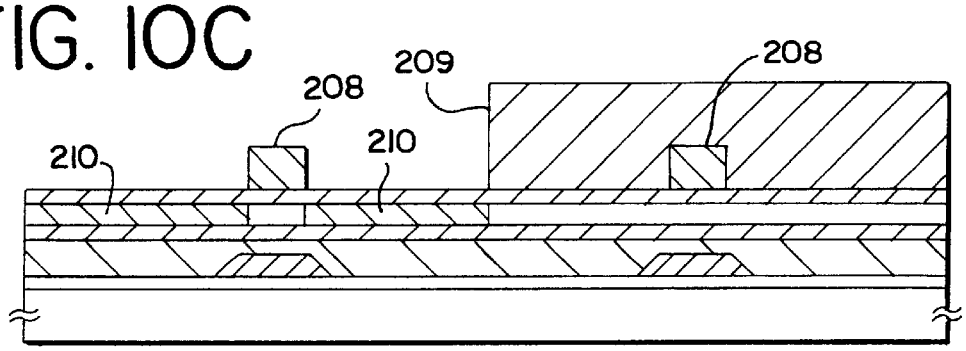

A photoresist mask 209 covering the P channel TFT part is then formed. Phosphorous is added to the polycrystalline silicon film 207 to form an N$^-$type region 210. (FIG. 10C)

Figure 10D:
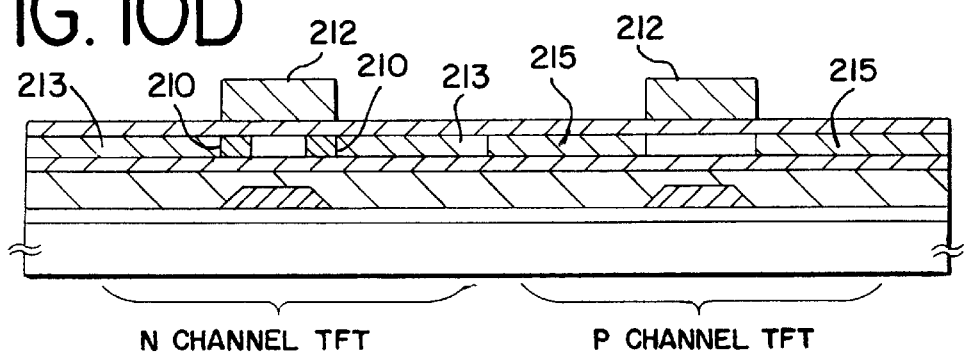

After removing the photoresist masks 208 and 209, another photoresist is applied, and exposure is again conducted from the back surface of the substrate 200 by using the gate wiring 202 as a mask, to form a photoresist mask 212 in a self alignment manner. The amount of exposure is adjusted in such a manner that the photoresist mask 212 has the same pattern as that of the gate wiring 202. A phosphorus ion is added by using the mask 121 by a plasma doping method, to selectively form an N+type region 213 and an N$^-$type region 215 in the polycrystalline silicon film. (FIG. 10D)

Figure 11A:
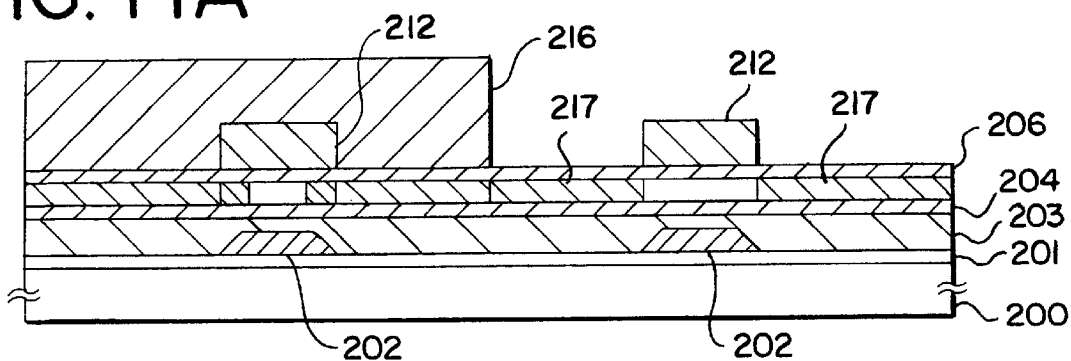

With the photoresist mask 212 remaining, a photoresist mask 216 covering the N channel TFT is then formed. A boron ion is added to the polycrystalline silicon film 207 by using the photoresist mask 212, to form a P$^+$type region 217 to be a source/drain region. (FIG. 11A)

After removing the photoresist masks 212 and 216, another photoresist mask is formed, and the protective film 206 is patterned into an island form by using the photoresist mask, to form protective films 235 and 236. The polycrystalline silicon film 207 is subsequently patterned into an island form by using the same photoresist mask to separate the N type region and the P type region.

Figure 11B:
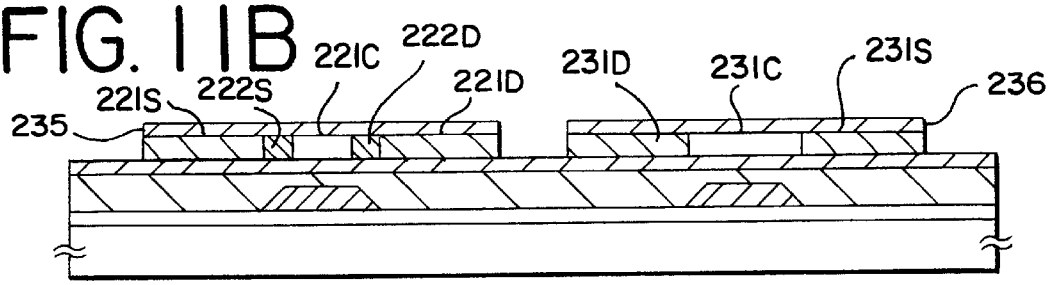

In the semiconductor layer of the N channel TFT, source/drain regions 221S and 221D comprising the N$^+$type region 213, low concentration impurity regions 222S and 222D comprising the N$^-$type region 210, and a channel forming region 221C comprising a region which had been covered with the mask 208 are formed. In the semiconductor layer of the P channel TFT, on the other hand, source/drain regions 231S and 231D comprising the P$^+$type region 217 and a channel forming region 231C comprising a region which had been covered with the mask 208 are formed. (FIG. 11B)

Figure 11C:
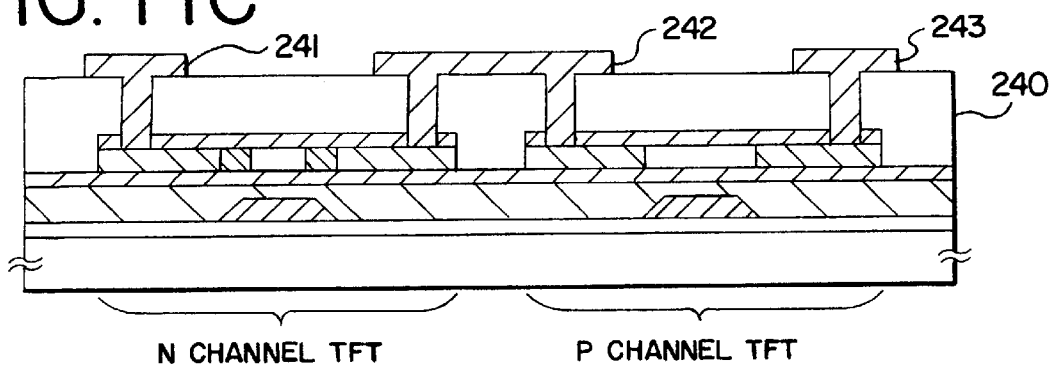

An interlayer insulating film 240 covering the semiconductor layer is then formed. In this example, an accumulated film comprising an $SiN_y$ film having a thickness of 50 nm and an $SiO_2$ film having a thickness of 900 nm is formed. In the interlayer insulating film 240, contact holes reaching the source/drain region and a contact hole at the gate contact part are formed. Furthermore, at the gate contact part, the $SiN_y$ film 204 and the BCB film 203 are etched to form a contact hole reaching the gate wiring 202. An accumulated film comprising a Ti film having a thickness of 150 nm, an Al film having a thickness of 300 nm and a Ti film having a thickness of 100 nm is formed, and the conductive film is patterned to form wirings 241 to 243 and a lead electrode 244, so that the CMOS circuit is completed. (FIG. 11C)

Figure 11D:
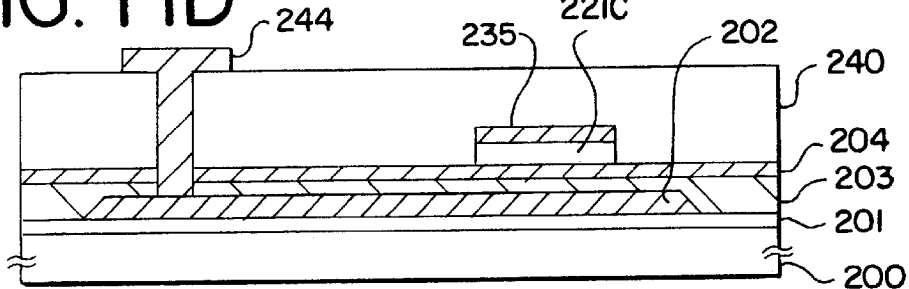

A cross sectional view of the N channel TFT along the direction of the channel width is shown in FIG. 11D. Unlike Examples 1 and 2, the protective films 235 and 236 in this example has the same pattern as that of the conductive film in an island form of the TFT.

EXAMPLE 4

In this example, the TFT described in Example 1 is applied to an active matrix substrate. The active matrix substrate in this example is used in a flat electro-optical apparatus, such as a liquid crystal display device and an EL display device.

Figure 12:
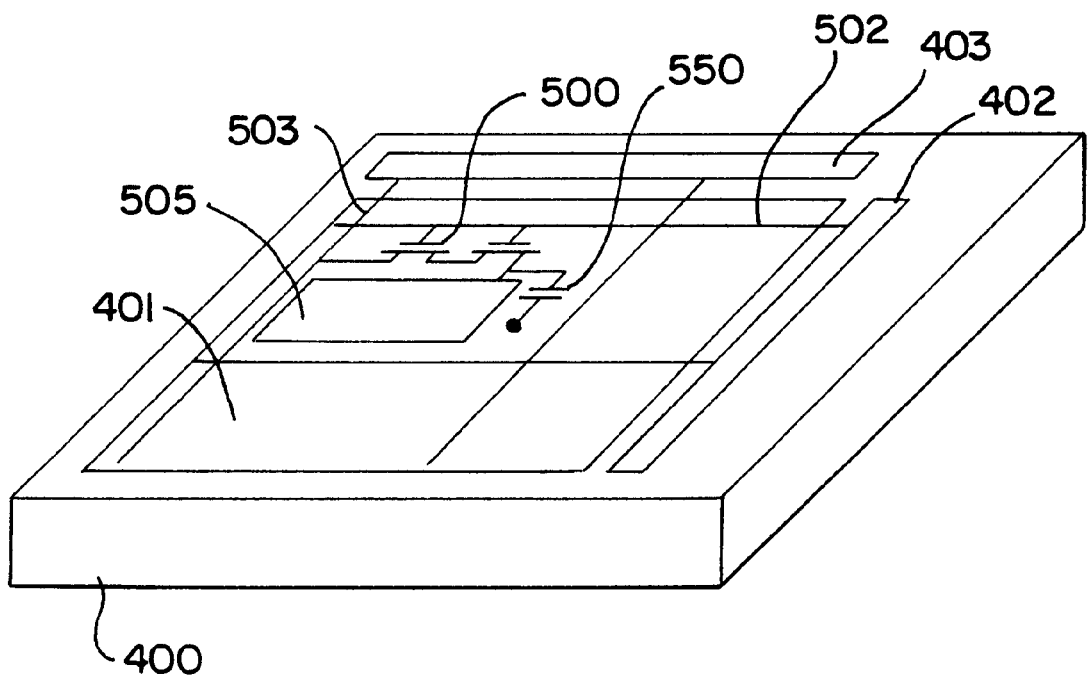
FIG. 12 is a perspective view of an active matrix substrate in Example 4.

This example will be described with reference to FIGS. 12, 13A, 13B and 14. In FIGS. 12, 13A, 13B and 14, the same symbols represent the same constitutional components. FIG. 12 is a schematic perspective view showing an active matrix substrate of this example. The active matrix substrate comprises a glass substrate 400 having formed thereon a pixel matrix circuit 401, a scanning line driver circuit 402 and a signal line driver circuit 403. The scanning line driver circuit 402 and the signal line driver circuit 403 are connected to the pixel matrix circuit 401 by a scanning line 502 and a signal line 503, respectively, and the driver circuits 402 and 403 mainly comprise a CMOS circuit.

The scanning line 502 is formed for each row of the pixel matrix circuit 401, and the signal line 503 is formed for each column thereof. In the vicinity of a point of intersection of the scanning line 502 and the signal line 503, a pixel TFT 500 connected to the lines 502 and 503 is formed. A pixel electrode 505 and an auxiliary capacitance 550 are connected to the pixel TFT 500.

According to the production process of the TFT in Example 1, an N channel TFT and a P channel TFT of the driver circuits 402 and 403, and the pixel TFT 500 of the pixel matrix circuit 401 are completed.

Figure 13A:
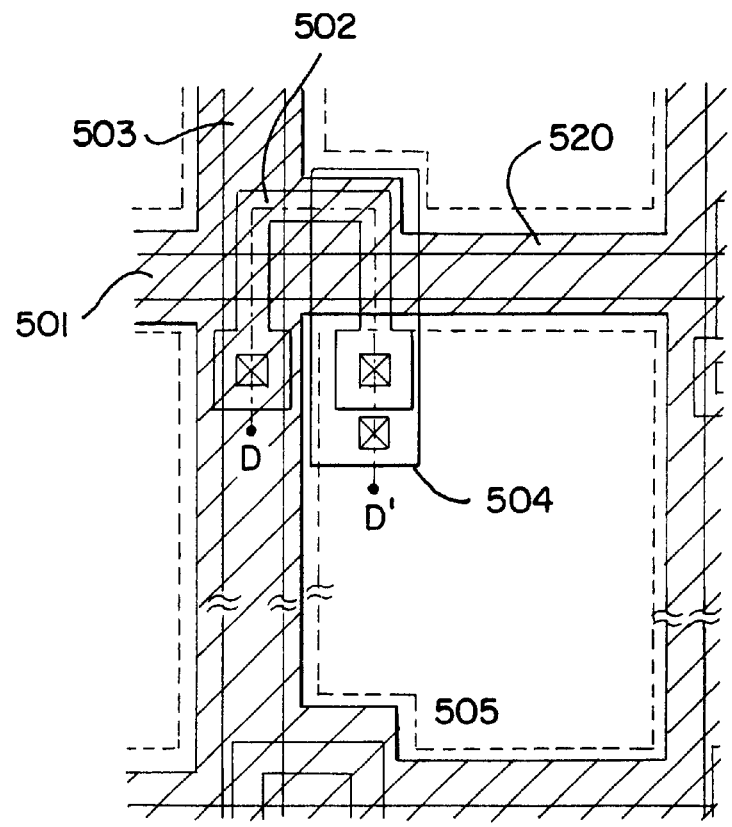
FIGS. 13A and 13B are plan views of a pixel matrix circuit and the CMOS circuit, respectively.
Figure 13B:
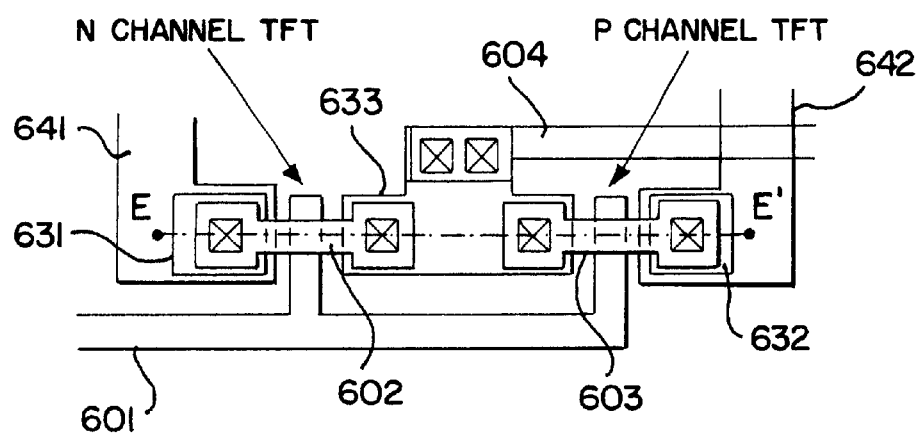
Figure 14:
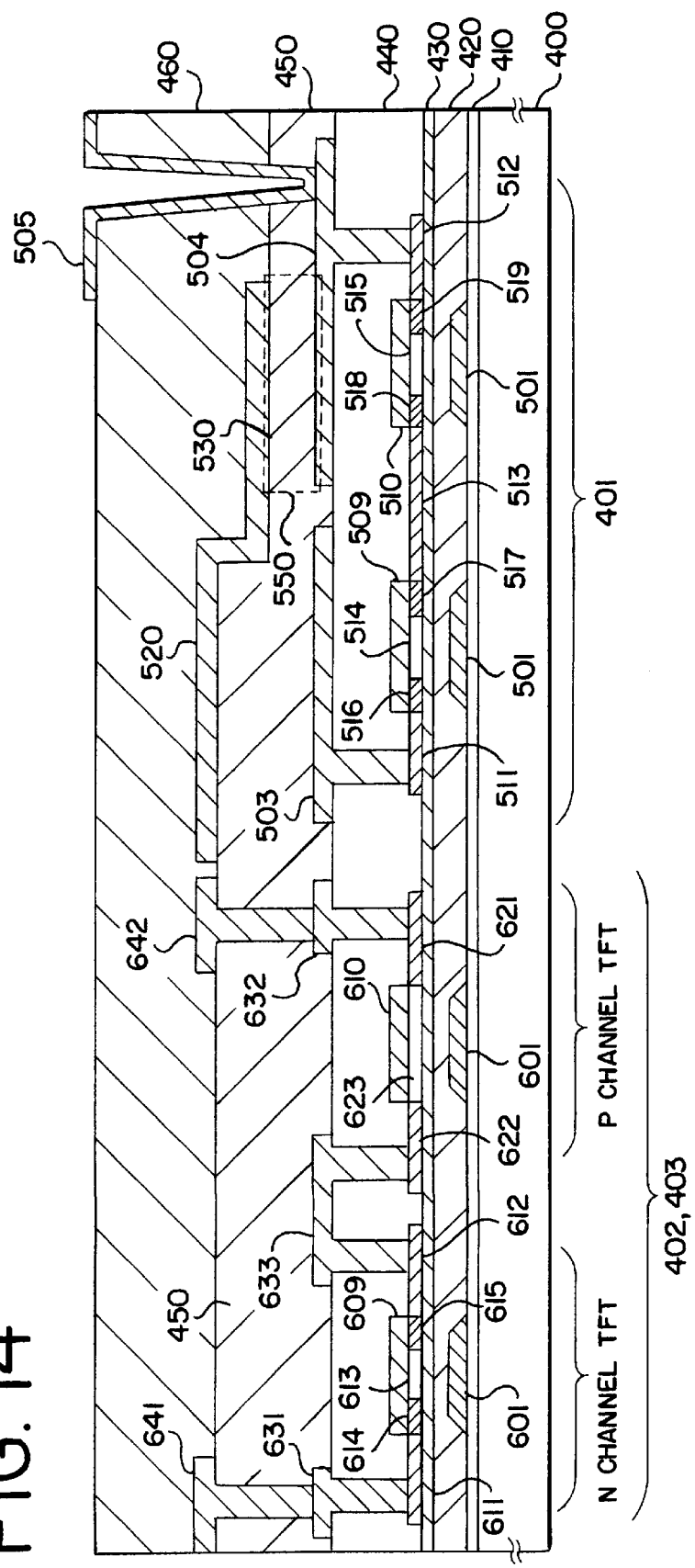
FIG. 14 is a cross sectional view of an active matrix substrate.

FIG. 13A is a plan view showing the pixel matrix circuit 401, which substantially corresponds to a plan view of one pixel. FIG. 13B is a plan view showing the CMOS circuit constituting the driver circuits 402 and 403. FIG. 14 is a cross sectional view showing the active matrix substrate, which includes cross sectional views of the pixel matrix circuit 401 and the CMOS circuit. The cross sectional view of the pixel matrix circuit 401 is one along the chain line D–D' in FIG. 13A, and the cross sectional view of the CMOS circuit is one along the chain line E–E' in FIG. 13B.

The pixel TFT 500 of the pixel matrix circuit 401 is an N channel TFT. A scanning line 501 as a wiring of the first layer, a flattening film 420 comprising an insulating organic resin film, an insulating inorganic film 430 and a semiconductor layer 502 having a U shape (horseshoe shape) are accumulated in this order on an underlying film 410.

In the semiconductor film 502, $N^+$type regions 511 to 513, two channel forming regions 514 and 515, and low concentration impurity regions ($N^-$type regions) 516 to 519 are formed. The $N^+$type regions 511 and 512 are source/drain regions. Protective films 509, 510 are formed on the semiconductor layer 502.

In the CMOS circuit, one gate wiring 601 crosses semiconductor layers 602 and 603 as sandwiching the flattening film 420 and the insulating inorganic film 430. In the semiconductor layer 602, source/drain regions ($N^+$type regions) 611 and 612, a channel forming region 613, and low concentration impurity regions ($N^-$type regions) 614 and 615 are formed. In the semiconductor layer 603, source/drain regions ($P^+$type regions) 621 and 622, and a channel forming region 623 are formed. Protective films 609, 610 are formed on the semiconductor layers 602, 603 respectively.

After forming the source/drain regions in the semiconductor layers 502, 602 and 603, an interlayer insulating film 440 is formed on the whole surface of the substrate. A signal line 503, a drain electrode 504, source electrodes 631 and 632, and a drain electrode 633, as wirings of the second layer, are formed on the interlayer insulating film 440.

The scanning line 501 crosses the signal line 503 at right angles as sandwiching the interlayer insulating film 440 as shown in FIG. 13A. The drain electrode 504 functions as a lead electrode to connect the drain region 512 to the pixel electrode 505, and also functions as a lower electrode of the auxiliary capacitance 550. The drain electrode 504 is made to have an area as large as possible if not reducing the aperture ratio.

As shown in FIG. 13B, the drain electrode 633 of the CMOS circuit is connected to a gate wiring 604 (a wiring of the first layer) of another TFT.

An interlayer insulating film 450 having a flattening film is formed on the wirings and the electrodes of the second layer. In this example, an accumulated film comprising a silicon nitride film (50 nm), a silicon oxide film (25 nm) and an acrylic film (1 μm) is used as the interlayer insulating film 450. As the flattening film, polyimide, and benzocyclobutene (BCB) may be used instead of acrylic.

A source wiring 641, a drain electrode 642, a drain wiring 643 and a black mask 520, which comprise a light shielding conductive film, such as titanium and chromium, as wirings of the third layer, are formed on the interlayer insulating film 450. As shown in FIG. 13A, the black mask 520 constitutes one united body in the pixel matrix circuit 401, and is formed to cover all regions that do not contribute to display as overlapping the periphery of the pixel electrode 505. The electric potential of the black mask 520 is set at a prescribed value.

Before forming the wirings 641, 642 and 520 of the third layer, the interlayer insulating film 450 is etched to form a concave part 530, in which only the lowermost silicon nitride layer remains, is formed on the drain electrode 504.

Because the drain electrode 504 faces the black mask 520 as sandwiching only the silicon nitride film in the concave part 530, the auxiliary capacitance 550, which comprises the drain electrode 504 and the black mask 520 as the electrodes and the silicon nitride film as the dielectric, is formed in the concave part 530. The silicon nitride has a high dielectric constant, and thus a large capacitance can be obtained by reducing the thickness thereof.

An interlayer insulating film 460 is formed on the wirings 641, 642 and 520 of the third layer. The interlayer insulating film 460 is formed with an acrylic film having a thickness of 1.5 μm. It may be formed with other flattening films, such as polyimide and BCB, instead of acrylic. By forming the interlayer insulating film 460 with a flattening film, the step formed by providing the auxiliary capacitance 550 can be flattened.

A contact hole is formed in the interlayer insulating films 450 and 460, and a pixel electrode 505 comprising a transparent conductive film, such as ITO and tin oxide, is formed. Thus, the active matrix substrate is completed.

In the case where the active matrix substrate of this example is applied to a liquid crystal display device, an oriented film, not shown in the figure, is formed to cover the whole surface of the substrate. The oriented film may be subjected to a rubbing treatment depending on necessity.

By using a conductive film having a high reflective index, typically aluminum or a material comprising mainly aluminum, as the pixel electrode 505, an active matrix substrate for a reflection type AMLCD can be produced.

While the pixel TFT 500 in this example has a double gate structure, it may have a single gate structure or a multi-gate structure, such as a triple gate structure. The structure of the active matrix substrate of the invention is not limited to the structure in this example.

EXAMPLE 5

In this example, an active matrix type liquid crystal display device (referred to as AMLCD) is described as an example of an electro-optical apparatus using the active matrix substrate described in Example 4.

Figure 15A:
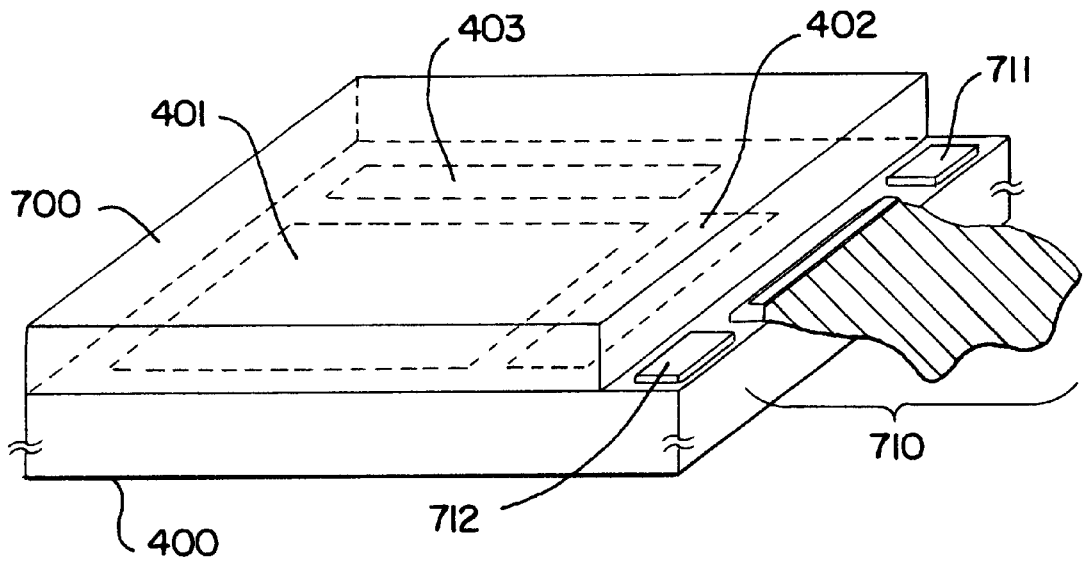
FIGS. 15A and 15B are plan views of active matrix type liquid crystal panels.
Figure 15B:
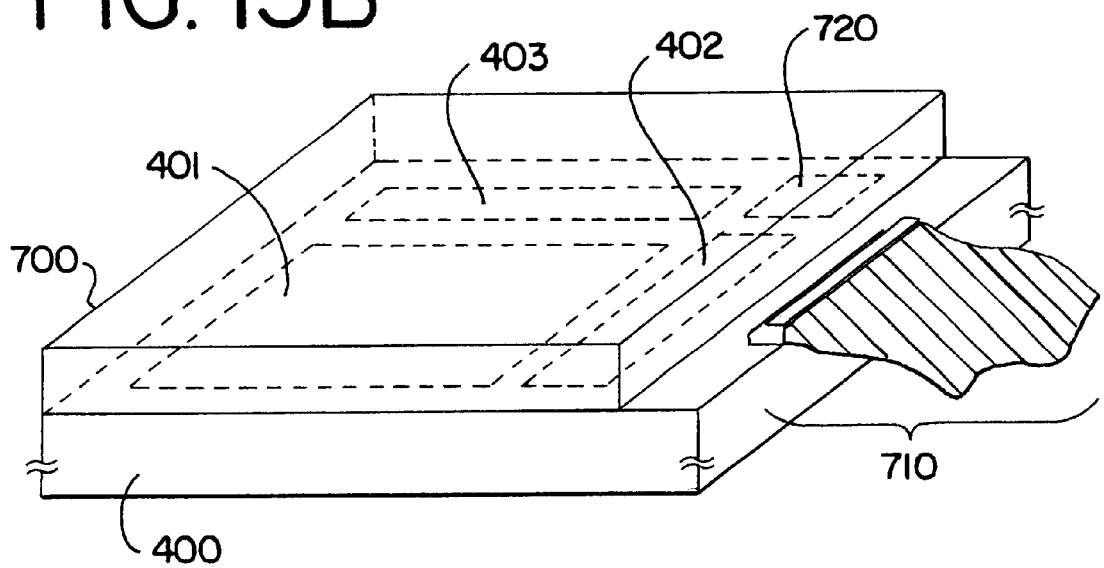

Outer appearances of the AMLCD of this example are shown in FIGS. 15A and 15B. In FIG. 15A, the same symbols as in FIG. 12 represent the same constitutional components. The active matrix substrate comprises a glass substrate 400 having formed thereon a pixel matrix circuit 401, a scanning line driver circuit 402 and a signal line driver circuit 403.

The active matrix substrate is bonded to a counter substrate 700. A liquid crystal is sealed in a gap between the substrates. An external terminal is formed on the active matrix substrate during the production process of the TFT, and a part where the external terminal is formed does not face the counter substrate 700. An FPC (flexible printed circuit) 710 is connected to the external terminal, and an external signal is transferred to the circuits 401 to 403 through the FPC 710.

The counter substrate 700 comprises a glass substrate having on the whole surface thereof a transparent conductive film, such as an ITO film. The transparent conductive film functions as a counter electrode of the pixel electrode of the pixel matrix circuit 401, and the liquid crystal material is driven by an electric field formed between the pixel electrode and the counter electrode. Furthermore, an oriented film and a color filter may be formed in the counter substrate 700 depending on necessity.

In the active matrix substrate of this example, IC chips 711 and 712 are attached by utilizing the surface, to which the FPC 710 is attached. The IC chips are constituted by forming circuits, such as a circuit for processing video signals, a circuit for generating a timing pulse, a gamma compensation circuit, a memory circuit and an operation circuit, on a silicon substrate. While two IC chips are attached in FIG. 15A, the number of the IC chips may be one, or three or more.

The constitution shown in FIG. 15B is also possible. In FIG. 15B, the same symbols are attached to the same constitutional components in FIG. 15A. FIG. 15B shows an example, in which the signal processing that is conducted by the IC chips in the constitution in FIG. 15A is conducted by a logic circuit 720 constituted with TFTs formed on the same substrate. In this case, the logic circuit 720 is constituted based on a CMOS circuit, as similar to the driver circuits 402 and 403.

While a constitution where a black mask is provided on the active matrix substrate (BM on TFT) is employed in this example, a constitution where another black mask is further provided on the counter side may be employed.

Color display may be conducted by using a color filter, and a constitution using no color filter may be employed by driving the liquid crystal in an ECB (electric field control birefringence) mode or a GH (guest/host) mode. Furthermore, a constitution using a micro-lens array described in JP8-15686 may be employed. The JP-8-15686 is incorporated herein by reference.

EXAMPLE 6

The TFTs described in Examples 1 to 3 can be applied to various electro-optical apparatus and semiconductor circuits, in addition to an AMLCD.

Examples of the electro-optical apparatus other than an AMLCD include an EL (electroluminescence) display device and an image sensor.

Examples of the semiconductor circuit include an operation processing circuit, such as a microprocessor, and a high frequency module processing input and output signals of a portable equipment (such as an MMIC).

Accordingly, the invention can be applied to any semiconductor device that functions by a circuit constituted with an insulating gate type TFT.

EXAMPLE 7

The AMLCD described in Example 5 can be used as a display device of an electronic apparatus. The electronic apparatus herein is defined as a product equipped with an active matrix type display device.

Examples of the electronic apparatus include a video camera, a digital still camera, a projection display (a rear projection type and a front projection type), a head-mounted display (a goggle-like display), a car navigation system, a personal computer and a portable information terminal (such as a mobile computer, a cellular phone and an electronic book). Examples thereof are shown in FIGS. 16A to 16F and 17A to 17D.

Figure 16A:
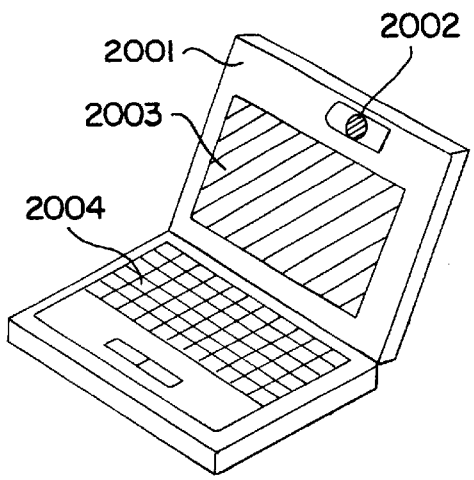
FIGS. 16A to 16F and 17A to 17D are diagrams showing constitutions of electronic equipments in Example 7.

FIG. 16A shows a personal computer, which comprises a main body 2001, an image receiving part 2002, a display device 2003 and a keyboard 2004. The invention can be applied to the image receiving part 2002, the display device 2003 and other signal processing circuits.

Figure 16B:
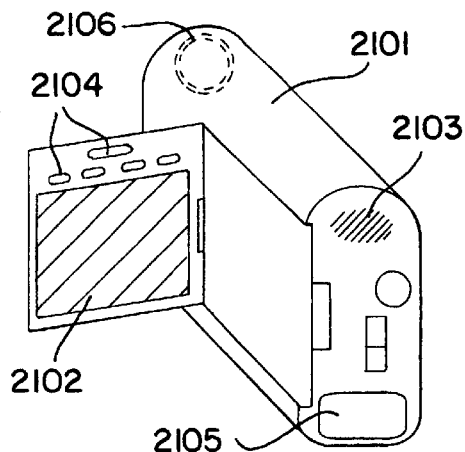

FIG. 16B shows a video camera, which comprises a main body 2101, a display device 2102, a voice receiving part 2103, an operation switch 2104, a battery 2105 and an image receiving part 2106. The invention can be applied to the display device 2102, the voice receiving part 2103 and other signal processing circuits.

Figure 16C:
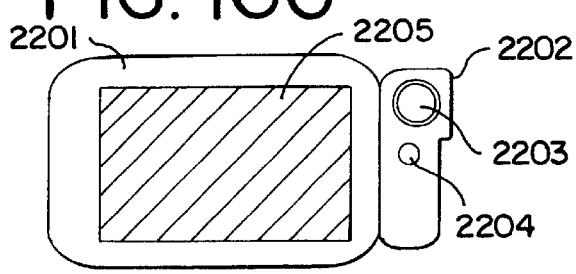

FIG. 16C shows a mobile computer, which comprises a main body 2201, a camera part 2202, an image receiving part 2203, an operation switch 2204 and a display device 2205. The invention can be applied to the display device 2205 and other signal processing circuits.

Figure 16D:
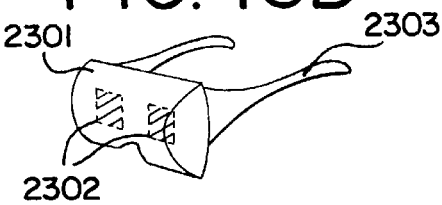

FIG. 16D shows a goggle-like display, which comprises a main body 2301, a display device 2302 and an arm part 2303. The invention can be applied to the display device 2302 and other signal processing circuits.

Figure 16E:
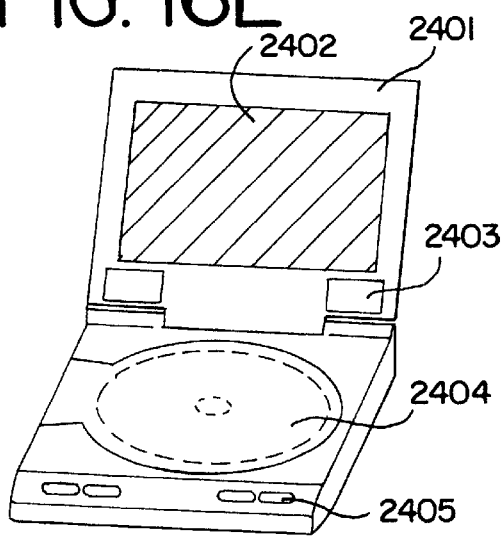

FIG. 16E shows a player for a recording medium in which a program is recorded (hereinafter referred to as a recording medium), which comprises a main body 2401, a display device 2402, a speaker part 2403, a recording medium 2404 and an operation switch 2405. In this apparatus, a DVD (digital versatile disk) and a CD are used as the recording medium to play music, movies and games, and to access the Internet. The invention can be applied to the display device 2402 and other signal processing circuits.

Figure 16F:
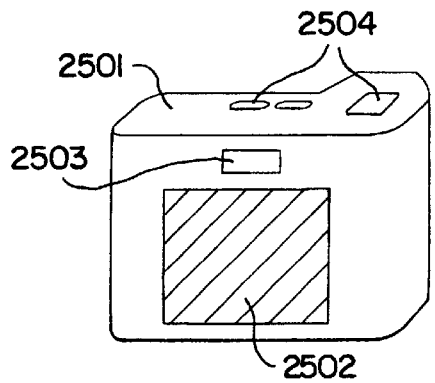

FIG. 16F shows a digital still camera, which comprises a main body 2501, a display device 2502, an eyepiece 2503, an operation switch 2504 and an image receiving part (not shown in the figure). The invention can be applied to the display device 2502 and other signal processing circuits.

Figure 17A:
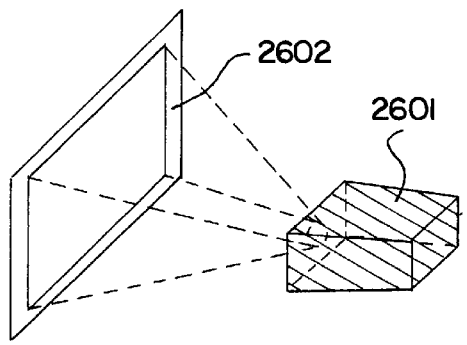

FIG. 17A shows a front projection display, which comprises a display device 2601 and a screen 2602. The invention can be applied to a display device and other signal processing circuits.

Figure 17B:
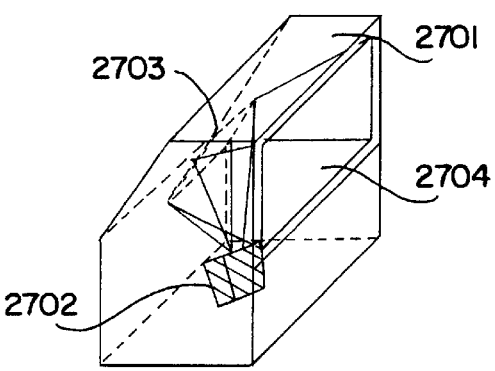

FIG. 17B shows a rear projection display, which comprises a main body 2701, a display device 2702, a mirror 2703 and a screen 2704. The invention can be applied to a display device and other signal processing circuits.

Figure 17C:
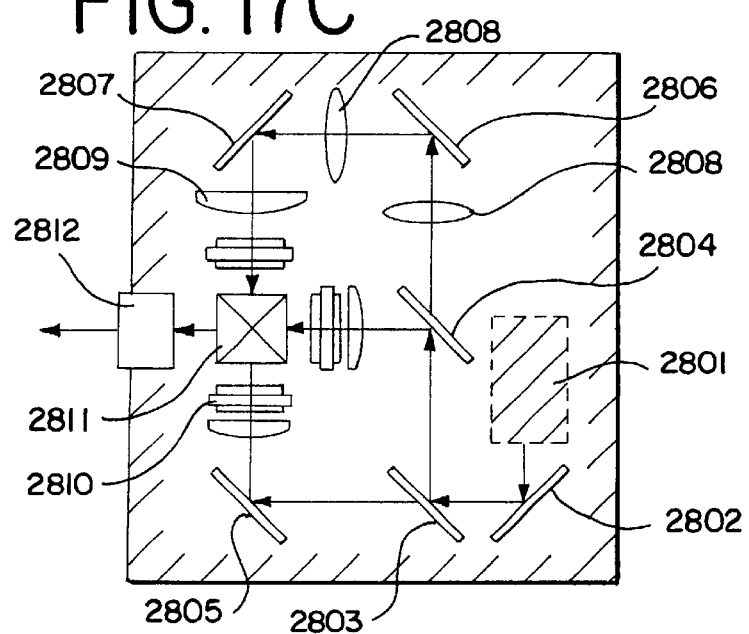

FIG. 17C shows an example of a structure of the display devices 2601 and 2702 shown in FIGS. 17A and 17B. The display devices 2601 and 2702 each comprises a light source optical system 2801, mirrors 2802 and 2804 to 2806, dichroic mirror 2803 and 2804, optical lenses 2808, 2809 and 2811, a liquid crystal display device 2810 and a projection optical system 2812. The projection optical system 2812 is constituted with an optical system comprising a projection lens. While a three-plate system is exemplified as the liquid crystal display device 2810 in this example, it is not limited thereto but a single plate system may be employed. Furthermore, on the light path shown by the arrow in FIG. 17C, an optical system, such as an optical lens, a film having a polarizing function, a film for adjusting phase difference and an IR film, may be provided by the practician.

Figure 17D:
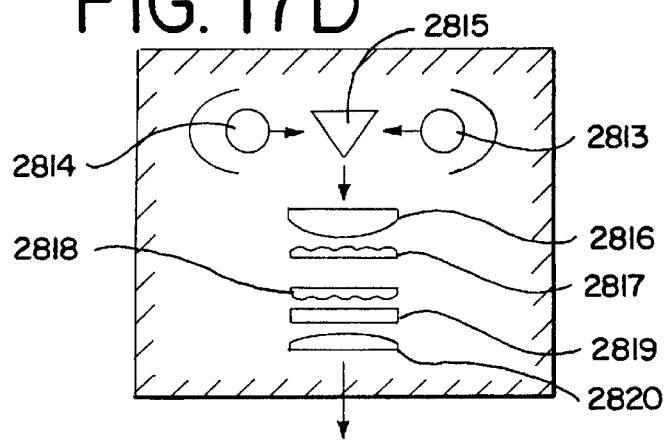
Figure 18A:
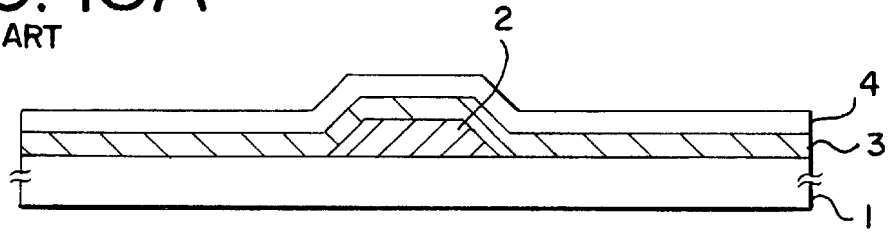
FIGS. 18A to 18D are cross sectional views showing a conventional process for producing a reverse stagger TFT.
Figure 18B:
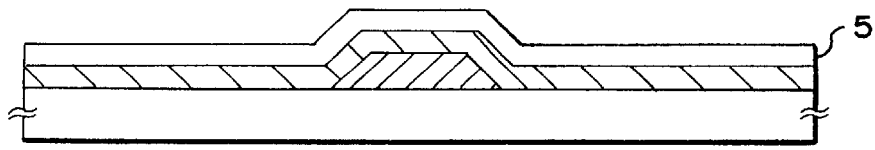
Figure 18C:
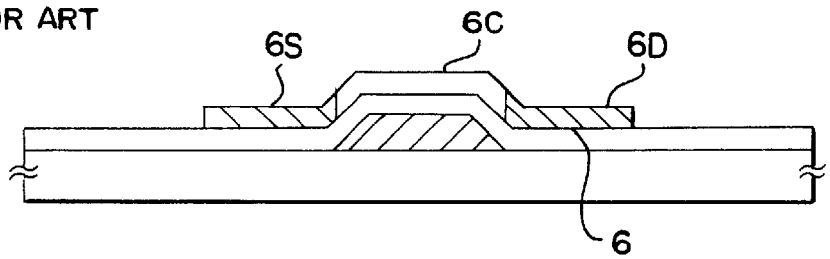
Figure 18D:
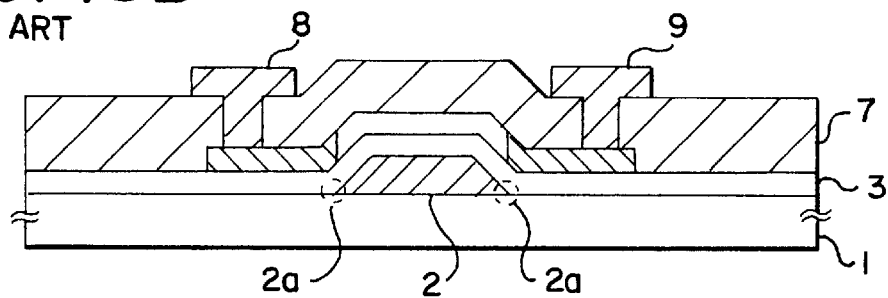

FIG. 17D shows an example of a structure of the light source optical system 2801 shown in FIG. 17C. In this example, the light source optical system 2801 comprises light sources 2813 and 2814, a composite prism 2815, collimator lenses 2816 and 2820, lens arrays 2817 and 2818 and a polarizing conversion device 2819. While the light source optical system shown in FIG. 17D uses two light sources, but three or four light sources, or more than four light sources may be used, and only one light source may be used. Furthermore, an optical system, such as an optical lens, a film having a polarizing function, a film for adjusting phase difference and an IR film, may be provided in the light source optical system by the practician. The light source optical system may be applied to the single plate system.

As described in the foregoing, the field of application of the invention is extremely broad, and the invention can be applied to any electronic apparatus of all the fields. Furthermore, an electronic apparatus of this example can be realized by any combination obtained from Examples 1 to 6.

In the invention, because a gate insulating film has an accumulated film comprising a flattening film comprising an insulating organic resin and an insulating inorganic film, and the step formed by the gate wiring is flattened by the flattening film, a gate insulating film having a flat surface can be obtained.

Therefore, because a semiconductor film formed on the surface of the gate insulating film can be flat, deviation of the focal point of laser light among each position on the surface can be eliminated, and the semiconductor film can be uniformly crystallized.

Furthermore, because the thickness of the flattening film does not become thin at the edge part of the gate wiring, a short circuit between the gate wiring and the semiconductor layer, shift of the threshold voltage due to implantation of an electron or a hole to the gate insulating film, and electrostatic breakage of the gate insulating film can be prevented.

What is claimed is:

1. A process for producing a semiconductor device comprising:
    forming a gate wiring on an insulating surface;
    forming a flattening film comprising an insulating organic resin to cover said gate wiring;
    forming an insulating inorganic film in contact with said flattening film;
    forming a semiconductor film having an amorphous component to cover said insulating inorganic film;
    forming a protective film in contact with said semiconductor film having an amorphous component; and
    crystallizing said semiconductor film having an amorphous component to form a crystalline semiconductor film,
    wherein said insulating inorganic film, said semiconductor film having an amorphous component, and said protective film are formed continuously without opening to the air.

2. A process for producing a semiconductor device as claimed in claim 1, wherein said semiconductor device is incorporated into an electronic apparatus selected from the group consisting of a personal computer, a video camera, a mobile computer, a goggle-like display, a recording medium, a digital still camera, a front projection display and a rear projection display.

3. A process for producing a semiconductor device as claimed in claim 1, wherein said semiconductor device is one selected from a liquid crystal display device, an electroluminescence display deice and an image sensor.

4. A process for producing a semiconductor device as claimed in claim 1, wherein in said step of forming said flattening film, said flattening film is formed by a coating method.

5. A process for producing a semiconductor device as claimed in claim 1, wherein in said step of forming said flattening film, said flattening film is formed with benzocyclobutene or polyimide.

6. A process for producing a semiconductor device as claimed in claim 1, wherein after forming said flattening film comprising an insulating organic resin, said process further comprises baking said flattening film,
    wherein baking said flattening film, forming said insulating inorganic film, forming said semiconductor film having an amorphous component, and forming said protective film are formed continuously without opening to the air.

7. A process for producing a semiconductor device as claimed in claim 1, wherein said step of forming said crystalline semiconductor film comprises a step of irradiating said semiconductor film having an amorphous component with laser light or high intensity light having a wavelength of 400 nm or less.

8. A process for producing a semiconductor device comprising a circuit comprising a thin film transistor formed on an insulating surface, said process comprising;
    forming a gate wiring on an insulating surface;
    forming a flattening film comprising an insulating organic resin to cover said gate wiring;
    forming an insulating inorganic film in contact with said flattening film;
    forming a semiconductor film having an amorphous component to cover said insulating inorganic film;

forming a protective film in contact with said semiconductor film having an amorphous component;

crystallizing said semiconductor film having an amorphous component to form a crystalline semiconductor film; and adding an impurity to said crystalline semiconductor film through at least a part of said protective film, to form a source region and a drain region, wherein said insulating inorganic film, said semiconductor film having an amorphous component, and said protective film are formed continuously without opening to the air.

9. A process for producing a semiconductor device as claimed in claim 8, wherein said semiconductor device is incorporated into an electronic apparatus selected from a group consisting of a personal computer, a video camera, a mobile computer, a goggle-like display, a recording medium, a digital still camera, a front projection display and a rear projection display.

10. A process for producing a semiconductor device as claimed in claim 8, wherein said semiconductor device is one selected from a liquid crystal display device, an electroluminescence display device and an image sensor.

11. A process for producing a semiconductor device as claimed in claim 9, wherein in said step of forming said flattening film, said flattening film is formed by a coating method.

12. A process for producing a semiconductor device as claimed in claim 8, wherein in said step of forming said flattening film, said flattening film is formed with benzocyclobutene or polyimide.

13. A process for producing a semiconductor device as claimed in claim 8, wherein after forming said flattening film comprising an insulating organic resin, said process further comprises baking said flattening film, wherein baking said flattening film, forming said insulating inorganic film, forming said semiconductor film having an amorphous component, and forming said protective film are formed continuously without opening to the air.

14. A process for producing a semiconductor device as claimed in claim 9, wherein said step of forming said crystalline semiconductor film comprises a step of irradiating said semiconductor film having an amorphous component with laser light or high intensity light having a wavelength of 400 nm or less.

15. A process for producing a semiconductor device comprising a circuit comprising a thin film transistor formed on an insulating surface, said process comprising:

forming a gate wiring on an insulating surface;

forming a flattening film comprising an insulating organic resin to cover said gate wiring;

forming an insulating inorganic film in contact with said flattening film;

forming a semiconductor film having an amorphous component to cover said insulating inorganic film;

forming a protective film in contact with said semiconductor film having an amorphous component;

crystallizing said semiconductor film having an amorphous component to form a crystalline semiconductor film;

patterning said protective film into an island form;

patterning said crystalline semiconductor film into an island form; and adding an impurity endowing a conductive type to said crystalline semiconductor film in an island form using said protective film in an island form as a mask, wherein said insulating inorganic film, said semiconductor film having an amorphous component, and said protective film are formed continuously without opening to the air.

16. A process for producing a semiconductor device as claimed in claim 15, wherein said step of patterning said protective film into an island form comprising:

coating a positive photoresist to cover said protective film;

patterning said photoresist by exposing to light from a back surface of said insulating surface, using said gate wiring as a mask in order to form a first mask; and patterning said protective film using said first mask.

17. A process for producing a semiconductor device as claimed in claim 15, wherein said step of adding said impurity comprising:

coating a positive photoresist to cover said protective film in an island form;

patterning said photoresist by exposing to light from a back surface of said insulating surface, using said gate wiring as a mask in order to form a first mask; and adding said impurity to said crystalline semiconductor film in an island form using said first mask and said protective film as a mask, wherein at a cross section in a direction of a channel length, a side surface of said first mask is positioned inside a side surface of said gate wiring.

18. A process for producing a semiconductor device as claimed in claim 15, wherein in said step of patterning said crystalline semiconductor film, said crystalline semiconductor film is patterned into the same pattern as in said protective film in an island form.

19. A process for producing a semiconductor device as claimed in claim 15, wherein said step of adding said impurity comprises:

forming a second mask comprising coating a positive photoresist to cover said protective film in an island form, and patterning said photoresist by exposing to light from a back surface of said insulating surface, using said gate wiring as a mask;

adding said impurity to said crystalline semiconductor film in an island form using said second mask;

forming a third mask comprising coating a positive photoresist to cover said protective film in an island form, and patterning said photoresist by exposing to light from a back surface of said insulating surface, using said gate wiring as a mask; and adding said impurity to said crystalline semiconductor film in an island form using said third mask, wherein at a cross section in a direction of a channel length, a side surface of said third mask is positioned inside a side surface of said gate wiring.

20. A process for producing a semiconductor device as claimed in claim 15, wherein in said step of forming said flattening film, said flattening film is formed by a coating method.

21. A process for producing a semiconductor device as claimed in claim 15, wherein in said step of forming said flattening film, said flattening film is formed with benzocyclobutene or polyimide.

22. A process for producing a semiconductor device as claimed in claim 15, wherein after forming said flattening film comprising an insulating organic resin, said process further comprises baking said flattening film, wherein baking said flattening film, forming said insulating inorganic film, forming said semiconductor film having an amorphous component, and forming said protective film are formed continuously without opening to the air.

23. A process for producing a semiconductor device as claimed in claim 15, wherein said step of forming said crystalline semiconductor film comprises a step of irradiating said semiconductor film having an amorphous component with laser light or high intensity light having a wavelength of 400 nm or less.

24. A process for producing a semiconductor device comprising a circuit comprising a thin film transistor formed on an insulating surface, said process comprising:

forming a gate wiring on an insulating surface;

forming a flattening film comprising an insulating organic resin to cover said gate wiring;

forming an insulating inorganic film in contact with said flattening film;

forming a semiconductor film having an amorphous component to cover said insulating inorganic film;

forming a protective film in contact with said semiconductor film having an amorphous component;

crystallizing said semiconductor film having an amorphous component to form a crystalline semiconductor film;

patterning said protective film into an island form;

adding an impurity endowing a conductive type to said crystalline semiconductor film through at least a part of said protective film; and patterning said crystalline semiconductor film into an island form;

wherein said insulating inorganic film, said semiconductor film having an amorphous component, and said protective film are formed continuously without opening to the air.

25. A process for producing a semiconductor device as claimed in claim 24, wherein said step of patterning said protective film comprising:

coating a positive photoresist to cover said protective film;

patterning said photoresist by exposing to light from a back surface of said insulating surface, using said gate wiring as a mask in order to form a first mask; and patterning said protective film using said first mask.

26. A process for producing a semiconductor device as claimed in claim 24, wherein said step of adding said impurity comprising:

coating a positive photoresist to cover said protective film in an island form;

patterning said photoresist by exposing to light from a back surface of said insulating surface, using said gate wiring as a mask in order to form a first mask; and adding said impurity to said crystalline semiconductor film in an island form using said first mask and said protective film as a mask, wherein at a cross section in a direction of a channel length, a side surface of said first mask is positioned inside a side surface of said gate wiring.

27. A process for producing a semiconductor device as claimed in claim 24, wherein said semiconductor device is incorporated into an electronic apparatus selected from a group consisting of a personal computer, a video camera, a mobile computer, a goggle-like display, a recording a digital still camera, a front projection display and a rear projection display.

28. A process for producing a semiconductor device as claimed in claim 24, wherein said semiconductor device is one selected from a liquid crystal display device, an electroluminescence display device and an image sensor.

29. A process for producing a semiconductor device as claimed in claim 24, wherein in said step of forming said flattening film, said flattening film is formed by a coating method.

30. A process for producing a semiconductor device as claimed in claim 24, wherein in said step of forming said flattening film, said flattening film is formed with benzocyclobutene or polyimide.

31. A process for producing a semiconductor device as claimed in claim 24, wherein after forming said flattening film comprising an insulating organic resin, said process further comprises baking said flattening film, wherein baking said flattening film, forming said insulating inorganic film, forming said semiconductor film having an amorphous component, and forming said protective film are formed continuously without opening to the air.

32. A process for producing a semiconductor device as claimed in claim 24, wherein said step of forming said crystalline semiconductor film comprises a step of irradiating said semiconductor film having an amorphous component with laser light or high intensity light having a wavelength of 400 nm or less.

33. A process for producing a semiconductor device comprising a circuit comprising a thin film transistor formed on an insulating surface, said process comprising:

forming a gate wiring on an insulating surface;

forming a flattening film comprising an insulating organic resin to cover said gate wiring;

forming an insulating inorganic film in contact with said flattening film;

forming a semiconductor film having an amorphous component to cover said insulating inorganic film;

forming a protective film in contact with said semiconductor film having an amorphous component;

crystallizing said semiconductor film having an amorphous component to form a crystalline semiconductor film;

adding an impurity endowing a conductive type to said crystalline semiconductor film through said protective film, to form a source region and a drain region; and patterning said protective film into an island form; and patterning said crystalline semiconductor film into an island form, wherein said insulating inorganic film, said semiconductor film having an amorphous component, and said protective film are formed continuously without opening to the air.

34. A process for producing a semiconductor device as claimed in claim 33, wherein said step of adding said impurity comprising:

coating a positive photoresist to cover said protective film;

patterning said photoresist by exposing to light from a back surface of said insulating surface, using said gate wiring as a mask in order to form a first mask; and adding said impurity to said crystalline semiconductor film in an island form using said first mask and said protective film as a mask, coating a positive photoresist to cover said protective film;

patterning said photoresist by exposing to light from a back surface of said insulating surface, using said gate wiring as a mask in order to form a second mask; and adding said impurity to said crystalline semiconductor film in an island form using said second mask, wherein at a cross section in a direction of a channel length, a side surface of said second mask is positioned inside aside surface of said gate wiring.

35. A process for producing a semiconductor device as claimed in claim 33, wherein in said step of patterning said crystalline semiconductor film into an island form, said crystalline semiconductor film is patterned into the same pattern as in said protective film in an island form.

36. A process for producing a semiconductor device as claimed in claim 33, wherein said semiconductor device is incorporated into an electronic apparatus selected from a group consisting of a personal computer, a video camera, a mobile computer, a goggle-like display, a recording medium, a digital still camera, a front projection display and a rear projection display.

37. A process for producing a semiconductor device as claimed in claim 33, wherein said semiconductor device is one selected from a liquid crystal display device, an electroluminescence display device and an image sensor.

38. A process for producing a semiconductor device as claimed in claim 33, wherein in said step of forming said flattening film, said flattening film is formed by a coating method.

39. A process for producing a semiconductor device as claimed in claim 33, wherein in said step of forming said flattening film, said flattening film is formed with benzocyclobutene or polyimide.

40. A process for producing a semiconductor device as claimed in claim 33, wherein after forming said flattening film comprising an insulating organic resin, said process further comprises baking said flattening film, wherein baking said flattening film, forming said insulating inorganic film, forming said semiconductor film having an amorphous component, and forming said protective film are formed continuously without opening to the air.

41. A process for producing a semiconductor device as claimed in claim 33, wherein said step of forming said crystalline semiconductor film comprises a step of irradiating said semiconductor film having an amorphous component with laser light or high intensity light having a wavelength of 400 nm or less.

* * * * *